(12) United States Patent
Kato et al.

(10) Patent No.: US 7,947,523 B2
(45) Date of Patent: May 24, 2011

(54) METHOD FOR MANUFACTURING PHOTOELECTRIC CONVERSION DEVICE

(75) Inventors: Sho Kato, Isehara (JP); Satoshi Toriumi, Ebina (JP); Fumito Isaka, Zama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 130 days.

(21) Appl. No.: 12/424,827

(22) Filed: Apr. 16, 2009

(65) Prior Publication Data

US 2009/0269875 A1  Oct. 29, 2009

(30) Foreign Application Priority Data

Apr. 25, 2008  (JP) ................. 2008-114744

(51) Int. Cl.
*H01L 21/00* (2006.01)
(52) U.S. Cl. ........... 438/57; 438/149; 438/455; 438/458
(58) Field of Classification Search ............ 438/57, 438/68, 89, 149, 455, 458, 459, 464, 486, 438/489
See application file for complete search history.

(56) References Cited

U.S. PATENT DOCUMENTS

| | | | |
|---|---|---|---|
| 4,496,788 A | 1/1985 | Hamakawa et al. | |
| 5,374,564 A | 12/1994 | Bruel | |
| 6,284,629 B1 | 9/2001 | Yokokawa et al. | |
| 6,534,380 B1 | 3/2003 | Yamauchi et al. | |
| 2004/0048454 A1* | 3/2004 | Sakaguchi | 438/486 |
| 2006/0281235 A1* | 12/2006 | Tayanaka | 438/151 |
| 2008/0303118 A1* | 12/2008 | Arena et al. | 257/615 |

FOREIGN PATENT DOCUMENTS

| | | |
|---|---|---|
| JP | 59-124772 | 7/1984 |
| JP | 59-175170 | 10/1984 |
| JP | 11-040786 | 2/1999 |
| JP | 11-097379 | 4/1999 |
| JP | 11-121310 | 4/1999 |

* cited by examiner

*Primary Examiner* — Kevin M Picardat
(74) *Attorney, Agent, or Firm* — Eric J. Robinson; Robinson Intellectual Property Law Office, P.C.

(57) ABSTRACT

An embrittlement layer is formed in the single crystal semiconductor substrate and a first impurity semiconductor layer, a first electrode, and an insulating layer are formed on one surface of the single crystal semiconductor substrate. After attaching the insulating layer and a supporting substrate to each other to bond the single crystal semiconductor substrate and the supporting substrate, the single crystal semiconductor substrate is separated along the embrittlement layer to form a stack including a first single crystal semiconductor layer. A first semiconductor layer and a second semiconductor layer are formed over the first single crystal semiconductor layer. A second single crystal semiconductor layer is formed by solid phase growth. A second impurity semiconductor layer having a conductivity type opposite to that of the first impurity semiconductor layer is formed on the second single crystal semiconductor layer. A second electrode is formed on the second impurity semiconductor layer.

52 Claims, 25 Drawing Sheets
(1 of 25 Drawing Sheet(s) Filed in Color)

METHOD FOR MANUFACTURING PHOTOELECTRIC CONVERSION DEVICE

BACKGROUND OF THE INVENTION

1. Field of the Invention

The present invention relates to a method for manufacturing a photoelectric conversion device using a single crystal semiconductor.

2. Description of the Related Art

The industrial growth has been boosting energy consumption worldwide. It is said that carbon dioxide is produced due to consumption of oil, coal, natural gas, and the like which are mainly used as energy resources, which has been a factor of drastic global warming. Therefore, photovoltaic power generation is being spread for alternative energy in recent years.

For photovoltaic power generation, although solar heat may be utilized, mainly employed is a method of converting light energy into electric energy with use of the photoelectric characteristic of a semiconductor. Devices for converting light energy into electric energy are generally called photoelectric conversion devices (also called photoelectromotive devices, solar cells, or the like).

Photoelectric conversion devices are already marketed and the production thereof has been expanding year by year with government supports for solar cells around the world. For example, the production of solar cells around the world in 2006 is 2521 MW, which has increased by more than 40% per annum. Here, above all, photoelectric conversion devices including crystalline semiconductors have become popular worldwide, and a large part of the production is occupied by the devices including single crystal silicon substrates or polycrystalline silicon substrates.

A variety of structures of photoelectric conversion devices have been disclosed. In addition to a typical structure in which an n-type or a p-type diffusion layer is formed in a single crystal silicon substrate or a polycrystalline silicon substrate, known is a structure in which a unit cell including a single crystal semiconductor or a polycrystalline semiconductor and a unit cell including an amorphous semiconductor or a microcrystalline semiconductor are combined (for example, see Patent Document 1: Examined Patent Application Publication No. H6-044638). Note that also in that case, a single crystal silicon substrate or a polycrystalline silicon substrate is used.

With the increase in production of photoelectric conversion devices, short of supply and rise of cost of raw material silicon which is the material of single crystal silicon or polycrystalline silicon, have become significant problems of the industry. Although major silicon suppliers in the world have already tried to increase capability of silicon production, the increase in demand outweighs the capability and the short of supply does not seem to be solved for some time.

In the case of using crystalline silicon, a thickness of about 10 μm is enough for the thickness of a silicon thin film. However, a single crystal silicon wafer is generally manufactured with a thickness of from about 600 μm to about 800 μm, whereas a polycrystalline silicon wafer is generally manufactured with a thickness of from about 200 μm to about 350 μm. That is to say, the thickness of a single crystal silicon substrate or a polycrystalline silicon substrate is several tens of times as large as a thickness required to form a photoelectric conversion device and the raw material Si is not used effectively. In view of this problem, it can be said that there is room for improvement in current photoelectric conversion devices.

In recent years, development has been actively conducted on an SOI (silicon on insulator) structure that includes a single crystal silicon thin film formed over a substrate having an insulating surface. Although an SOI substrate is expensive, the cost of the SOI substrate can be reduced by using an inexpensive substrate such as a glass substrate as a supporting substrate in comparison with the case of using a single crystal silicon substrate as a supporting substrate. Further, the consumption of silicon, which is a raw material, can be reduced. For such a technique, a method for manufacturing an SOI substrate in which a single crystal silicon thin film is fixed to a glass substrate is disclosed (for example, see Patent Document 2: Japanese Published Patent Application No. H11-097379).

SUMMARY OF THE INVENTION

In the case where a hydrogen ion implantation separation method is employed, a single crystal silicon thin film which is homogeneous can be formed at low temperature as compared with the case where a SIMOX method or a method in which thinning is performed utilizing grinding or polishing after bonding is used. Further, a single crystal silicon substrate from which a single crystal silicon thin film has been separated can be reused, so that effective utilization of resources can be achieved.

In the case of employing a hydrogen ion implantation separation method, the depth of ion implantation in a single crystal silicon substrate or the film thickness of a single crystal silicon thin film are determined depending on an ion acceleration voltage. The thickness of a single crystal silicon thin film is preferably 800 nm or more in consideration of photoelectric conversion efficiency.

However, increase in the acceleration voltage of an ion implantation apparatus has limitation based on the aspect of the apparatus, or radiation rays which are safety hazard might be generated due to increase of the acceleration voltage. Therefore, it is not easy to increase the acceleration voltage in order to obtain a single crystal silicon thin film with a predetermined thickness. Further, in the case of a conventional apparatus, since it is difficult to perform irradiation with a large amount of ions with the acceleration voltage increased, a long period of time is necessary for obtaining a predetermined amount of ions implanted into a single crystal silicon, which results in longer takt time.

In view of the foregoing problems, an object is to safely provide a photoelectric conversion device having an excellent photoelectric conversion characteristic while effectively utilizing limited resources.

According to an embodiment to be disclosed of the invention in this specification and the like (including at least description, claims, and drawings, and the like), the thickness of a single crystal semiconductor layer is increased by a solid phase growth (solid phase epitaxial growth) method. In more specific, the single crystal semiconductor layer is formed through the following process. First, a thin semiconductor layer with high crystallinity is formed over a single crystal semiconductor layer separated as a thin slice from a single crystal semiconductor substrate. Then, a thick semiconductor layer with low crystallinity is formed over the semiconductor layer with high crystallinity. After that, heat treatment or the like is performed on the foregoing layered structure to form a thick single crystal semiconductor layer by solid crystal growth.

The foregoing "semiconductor layer with high crystallinity" can be formed by a plasma CVD method using a mixed gas of a silane based gas and hydrogen. For example, hydrogen is contained in the mixed gas with respect to the silane based gas at a flow ratio of 50:1 or more, preferably 100:1 or more, so that the semiconductor layer with high crystallinity can be formed. Note that the "semiconductor layer with high crystallinity" is significantly affected by crystallinity of the single crystal semiconductor layer separated as a thin slice from a single crystal semiconductor substrate; therefore, the foregoing manufacturing method can also be called a vapor phase growth (vapor phase epitaxial growth) method, particularly. However, the semiconductor layer with high crystallinity is not limited to single crystal as long as the crystallinity of the semiconductor layer is higher than that of the "semiconductor layer with low crystallinity" formed later.

The "semiconductor layer with low crystallinity" may be formed by any method. For example, it can be formed by a plasma CVD method using a mixed gas of a silane based gas and hydrogen similarly to the "semiconductor layer with high crystallinity". In this case, a deposition rate of the "semiconductor layer with low crystallinity" is preferably high as compared with the case of the "semiconductor layer with high crystallinity". For example, the "semiconductor layer with low crystallinity" can be formed using a source gas in which hydrogen is contained in the mixed gas with respect to a silane based gas at a flow ratio of 2:1 or more and 20:1 or less (preferably, 5:1 or more and 15:1 or less).

A method for manufacturing a photoelectric conversion device, as an embodiment to be disclosed in the invention, includes following steps. A single crystal semiconductor substrate is irradiated with ions to form an embrittlement layer in the single crystal semiconductor substrate, and then, a first impurity semiconductor layer (which is defined as a semiconductor layer doped with an impurity in this specification), a first electrode, and an insulating layer are formed on one surface of the single crystal semiconductor substrate; the insulating layer and a support substarte are closely attached to each other and a stack including the insulating layer, the first electrode, the first impurity semiconductor layer, and a first single crystal semiconductor layer is formed on the support substrate by separating the single crystal semiconductor substrate along the embrittlement layer; a first semiconductor layer is formed on the first single crystal semiconductor layer, a second semiconductor layer is formed over the first semiconductor layer under forming conditions different from those of the first semiconductor layer, and then a second single crystal semiconductor layer is formed by improving crystallinity of the first semiconductor layer and the second semiconductor layer by solid phase growth; a second impurity semiconductor layer, which has a conductivity type opposite to that of the first impurity semiconductor layer, is formed over the second single crystal semiconductor layer and then a second electrode is formed over the second impurity semiconductor layer.

In the above, the first semiconductor layer and the second semiconductor layer are preferably formed such that crystallinity of the first semiconductor layer is higher than that of the second semiconductor layer. Further, the first semiconductor layer and the second semiconductor layer are preferably formed such that hydrogen concentration of the first semiconductor layer is lower than that of the second semiconductor layer. Further, it is desirable that the deposition rate of the second semiconductor layer be higher than that of the first semiconductor layer.

Note that the thickness of the first semiconductor layer is set to be from about 5 nm to about 100 nm (preferably, from 10 nm to 50 nm). Further, it is desirable to form the first single crystal semiconductor layer and the second single crystal semiconductor layer such that the total thickness thereof is 800 nm or more. Further, it is desirable to use, as the ions, ions generated with a source gas containing hydrogen.

Further, in the above, the first impurity semiconductor layer and the second impurity semiconductor layer can be a p-type impurity semiconductor layer and an n-type impurity semiconductor layer, respectively. It is needless to say that the first impurity semiconductor layer and the second impurity semiconductor layer may be an n-type impurity semiconductor layer and a p-type impurity semiconductor layer, respectively.

In the above, the first semiconductor layer is preferably formed by a plasma chemical vapor deposition method in which a flow ratio of hydrogen (gas) to a silane based gas is 50:1 or more. By this method, the first semiconductor layer with high crystallinity (low hydrogen concentration) can be formed. Here, silane or disilane is preferably used as the silane based gas. Further, the plasma chemical vapor deposition method is preferably performed under a pressure of from 1 Pa to $10^3$ Pa.

Note that in this specification, the term "single crystal" means a crystal which has a periodic structure and crystal axes oriented in the same direction in all portions of the crystal surface. However, single crystals in this specification may include a defect, lattice strain, or the like which causes disorder in the periodic structure.

According to an embodiment to be disclosed of the invention, the thickness of the single crystal semiconductor layer is increased by utilizing an epitaxial growth technique. Therefore, it is possible to increase photoelectric conversion efficiency while suppressing the consumption of a raw material. Further, since a surface layer of a single crystal semiconductor substrate is separated as a thin slice to be used as a single crystal semiconductor layer, it is possible to reduce the consumption of a single crystal semiconductor as a raw material. Further, since the thickness of the single crystal semiconductor layer to be required is not large, problems due to an acceleration voltage at the time of ion irradiation can be solved. Further, the single crystal semiconductor substrate from which the single crystal semiconductor layer has been separated can be reused repeatedly.

Note that according to an embodiment to be disclosed of the invention, after a crystalline semiconductor layer (which may be called a buffer layer) is formed over a single crystal semiconductor layer, a semiconductor layer with low crystallinity (for example, an amorphous semiconductor layer) is formed over the crystalline semiconductor layer. Accordingly, the semiconductor layer can be prevented from being peeled due to heat treatment or the like at the time of epitaxial growth. That is, the single crystal semiconductor layer with enough thickness can be formed with high yield by an epitaxial growth method.

As described above, by using an embodiment to be disclosed of the invention, the resources can be effectively utilized and a photoelectric conversion device having an excellent photoelectric conversion characteristic can be obtained.

BRIEF DESCRIPTION OF THE DRAWINGS

The patent or application file contains at least one drawing executed in color. Copies of this patent or patent application publication with the color drawing will be provided by the Office upon request and payment of the necessary fee.

In the accompanying drawings.

DETAILED DESCRIPTION OF THE INVENTION

Figure 1:
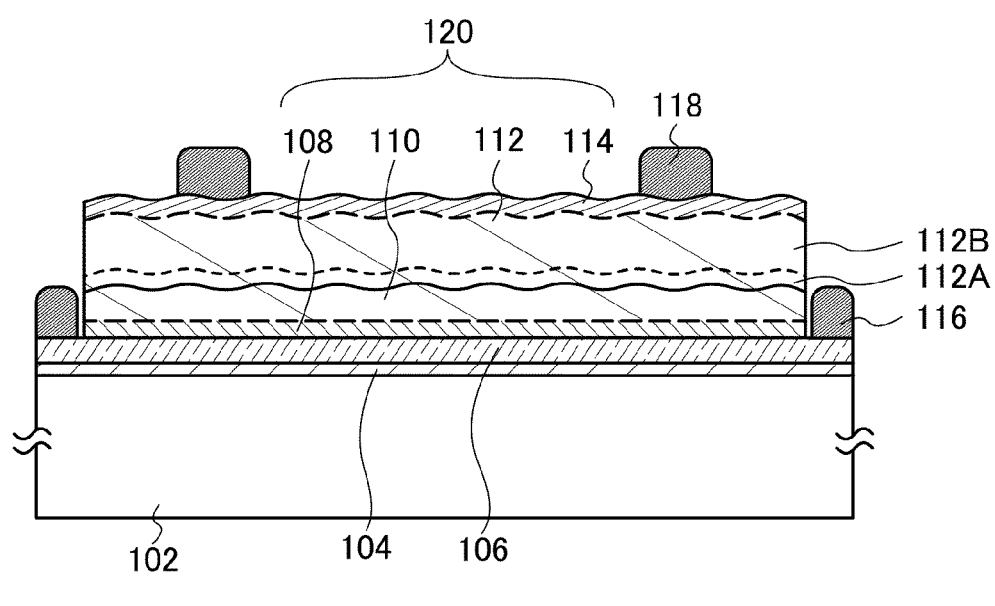
FIG. 1 is a cross-sectional view illustrating an example of a photoelectric conversion device.

The embodiments will be described with reference to the accompanying drawings. However, the invention is not limited to the following description, and it will be easily understood by those skilled in the art that various changes and modifications can be made to the modes and their details without departing from the spirit of the invention. In addition, the structures of any of the embodiments can be implemented in appropriate combination. Note that a common reference numeral refers to the same part or a part having a similar function throughout the drawings in the structure of the invention described below, and the description thereof is omitted.

Embodiment 1

Figure 2:
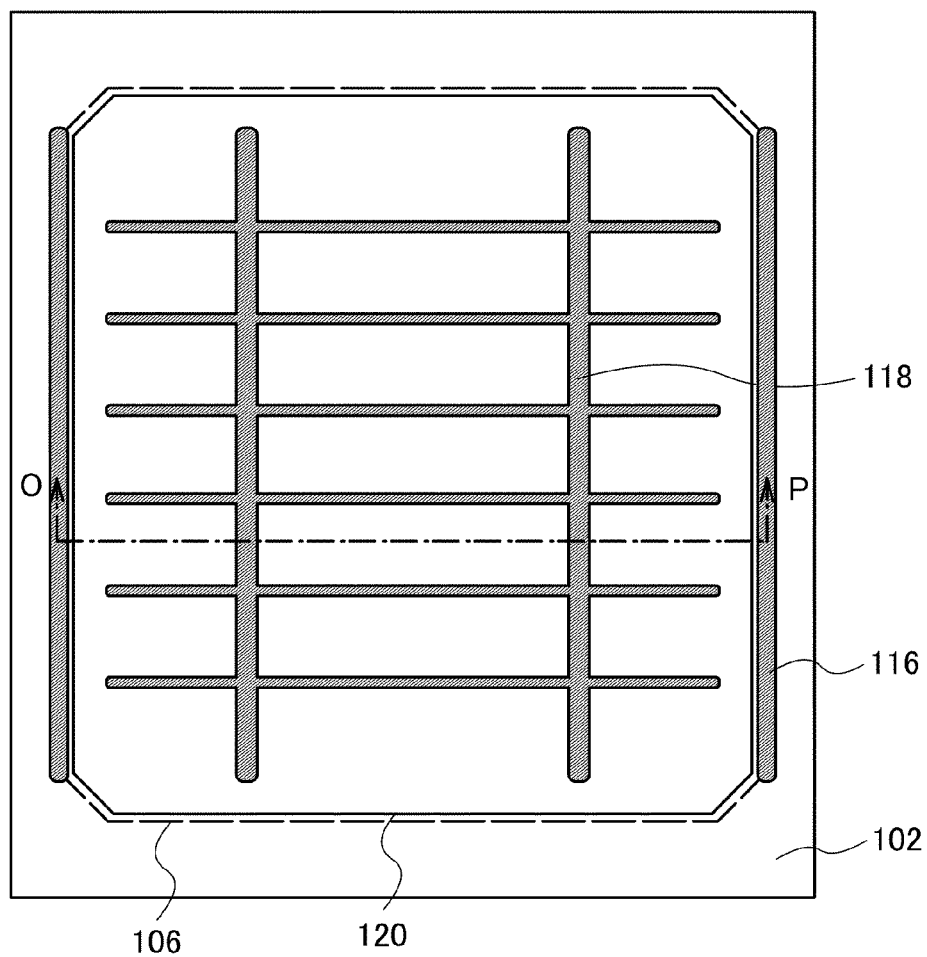
FIG. 2 is a plan view illustrating an example of a photoelectric conversion device.

FIG. 1 illustrates a schematic cross-sectional view of a photoelectric conversion device 100 according to this embodiment. FIG. 2 illustrates a schematic top view (plan view) of the photoelectric conversion device 100 according to this embodiment. Note that FIG. 1 illustrates an example of a cross-sectional view along O-P in FIG. 2.

The photoelectric conversion device 100 described in this embodiment has a structure in which an insulating layer 104, a first electrode 106, and a unit cell 120 are stacked in order on a supporting substrate 102. Here, the unit cell 120 has a layered structure of a first impurity semiconductor layer 108 having one conductivity type, a first single crystal semiconductor layer 110, a second single crystal semiconductor layer 112, and a second impurity semiconductor layer 114.

An auxiliary electrode 116 is formed in an area of the first electrode 106 where the unit cell 120 is not formed, so that electric energy can be extracted. Further, a second electrode 118 is formed over the unit cell 120. That is, an electrode for extracting electric energy is formed so as to be exposed on one side of the supporting substrate 102. Note that the second electrode 118 has a grid shape (or a comb-like shape or a pectinate shape) so that the area where the unit cell 120 receives light can be as large as possible.

The supporting substrate 102 is a substrate having an insulating surface or an insulating substrate. As the insulating substrate, a glass substrate of any of various types of glass used in the electronics industry, such as aluminosilicate glass, aluminoborosilicate glass, and barium borosilicate glass, can be used. Alternatively, an insulating substrate which is formed of an insulator, such as a ceramic substrate, a quartz substrate, or a sapphire substrate; a substrate which is formed of a conductor such as a metal or stainless steel and whose surface is subjected to insulation treatment; or the like may be used.

The insulating layer 104 has a function of bonding the supporting substrate 102 and the first electrode 106 to each other. From this point of view, the insulating layer 104 can be called a bonding layer. Further, since the first electrode 106 is formed in contact with the unit cell 120, the unit cell 120 is fixed to the supporting substrate 102 with the insulating layer 104.

Note that a surface of the insulating layer 104 to which the supporting substrate 102 (or the first electrode 106) is bonded preferably has an appropriate smoothness. This is because smooth surface enables firm bonding. For example, the insulating layer 104 is formed to have an average surface roughness ($R_a$) of 0.5 nm or less, preferably 0.3 nm or less. Note that the average surface roughness ($R_a$) in this specification refers to centerline average roughness expanded so as to be applied to a plane, which is defined by JIS B0601.

In the unit cell 120, each of the first impurity semiconductor layer 108 and the second impurity semiconductor layer 114 corresponds to a semiconductor layer to which an impurity element imparting a predetermined conductivity type has been added. Here, the first impurity semiconductor layer 108 and the second impurity semiconductor layer 114 have different conductivity types. That is, in the case where the first impurity semiconductor layer 108 has p-type conductivity, the second impurity semiconductor layer 114 has n-type conductivity, and in the case where the first impurity semiconductor layer 108 has n-type conductivity, the second impurity semiconductor layer 114 has p-type conductivity. An element belonging to Group 13 in the periodic table, such as boron or aluminum, can be used as an impurity element imparting p-type conductivity, and an element belonging to Group 15 in the periodic table, such as phosphorus or arsenic, can be used as an impurity element imparting n-type conductivity.

The first single crystal semiconductor layer 110 and the second single crystal semiconductor layer 112 are typically formed of single crystal silicon. Here, the second single crystal semiconductor layer 112 includes a lower layer region 112A and an upper layer region 112B which are formed by different methods. Note that in the case where the first single crystal semiconductor layer 110 and the second impurity semiconductor layer 114 have different conductivity types, the first single crystal semiconductor layer 110 can have a function of the first impurity semiconductor layer 108; therefore, the first impurity semiconductor layer 108 is not necessarily provided.

The first single crystal semiconductor layer 110 is formed by being separated from a single crystal semiconductor substrate. For example, ions of hydrogen or the like are introduced into the single crystal semiconductor substrate at high concentration so that the first single crystal semiconductor layer 110 is separated from the single crystal semiconductor substrate along a region to which the ions are introduced. As the single crystal semiconductor substrate, a single crystal silicon wafer may be used. Alternatively, the first single crystal semiconductor layer 110 may be formed as follows: a single crystal semiconductor layer is epitaxially grown on a porous semiconductor layer (typically, a porous silicon layer) and then separation is performed by water-jetting or the like.

The second single crystal semiconductor layer 112 is formed from a semiconductor layer formed over the first single crystal semiconductor layer 110. In specific, heat treatment is performed on the semiconductor layer to crystallize the semiconductor layer by solid phase epitaxial growth (SPE) using the first single crystal semiconductor layer 110 as a seed crystal, so that the second single crystal semiconductor layer 112 is formed.

Here, a semiconductor layer having a layered structure is used as the semiconductor layer which is a base of the second single crystal semiconductor layer 112. In more specific, a layered structure of a first semiconductor layer with high crystallinity on the first single crystal semiconductor layer and a second semiconductor layer with low crystallinity on the first semiconductor layer is employed. Alternatively, a layered structure of a first semiconductor layer with low hydrogen concentration (low hydrogen content) on the first single crystal semiconductor layer and a second semiconductor layer with high hydrogen concentration (high hydrogen content) on the first semiconductor layer may be employed. Note that by heat treatment, the first semiconductor layer forms the lower layer region 112A of the second single crystal semiconductor layer 112 and the second semiconductor layer forms the upper layer region 112B of the second single crystal semiconductor layer 112.

In consideration of photoelectric conversion efficiency, the total thickness of the first single crystal semiconductor layer 110 and the second single crystal semiconductor layer 112 is preferably 800 nm or more, more preferably 1000 nm or more. The thickness of the first single crystal semiconductor layer 110 is preferably from about 5 nm to about 300 nm or less (more preferably 300 nm or less), and the thickness of the second single crystal semiconductor layer 112 is preferably 300 nm or more (more preferably 500 nm or more). Although there are no particular limitations on the thicknesses of the first semiconductor layer and the second semiconductor layer which are a base of the second single crystal semiconductor layer, the second semiconductor layer is preferably thicker than the first semiconductor layer. This is because the deposition rate of the first semiconductor layer is likely to be lower than that of the second semiconductor layer due to characteristics of the first semiconductor layer and the second semiconductor layer. For example, the thickness of the first semiconductor layer can be from 5 nm to 100 nm or less (preferably from 10 nm to 50 nm), and the thickness of the second semiconductor layer can be 200 nm or more (preferably 400 nm or more).

Note that the first single crystal semiconductor layer 110 and the second single crystal semiconductor layer 112 have different conductivity types in some cases. For example, the first single crystal semiconductor layer 110 formed using a p-type single crystal semiconductor substrate has p-type conductivity, whereas the first single crystal semiconductor layer 110 formed using an n-type single crystal semiconductor substrate has n-type conductivity. Meanwhile, the second single crystal semiconductor layer 112 is an intrinsic (i-type) semiconductor in the case where the source gas used for the formation does not include an impurity imparting one conductivity type.

Next, an example of a method for manufacturing the photoelectric conversion device 100 according to this embodiment is described with reference to FIGS. 3A to 3D, FIG. 4A to 4C, FIGS. 5A to 5C, and FIGS. 6A and 6B.

First, a single crystal semiconductor substrate 103 is prepared. An embrittlement layer 105 is formed in a region at a predetermined depth of the single crystal semiconductor substrate 103, and a first impurity semiconductor layer 108 is formed in the vicinity of one surface of the single crystal semiconductor substrate 103. Further, the first electrode 106 and the insulating layer 104 are stacked in order over the one surface of the single crystal semiconductor substrate 103 (over the first impurity semiconductor layer 108) (see FIG. 3D).

The order of formation of the embrittlement layer 105, the first impurity semiconductor layer 108, the first electrode 106, and the insulating layer 104 is not particularly limited, and for example, they may be formed in accordance with any of the following (1) to (4).

(1) A protective layer is formed on one surface of a single crystal semiconductor substrate, a first impurity semiconductor layer is formed on the one surface of the single crystal semiconductor substrate by irradiating the single crystal semiconductor substrate with an impurity element imparting one conductivity type through a surface of the protective layer, and then, an embrittlement layer is formed in a region at a predetermined depth of the single crystal semiconductor substrate by irradiating the single crystal semiconductor substrate with ions through the surface of the protective layer. After removing the protective layer, a first electrode is formed over the first impurity semiconductor layer and then an insulating layer is formed over the first electrode.

(2) A protective layer is formed on one surface of a single crystal semiconductor substrate, an embrittlement layer is formed in a region at a predetermined depth of the single crystal semiconductor substrate by irradiating the single crystal semiconductor substrate with ions through a surface of the protective layer, and then, a first impurity semiconductor layer is formed on the one surface of the single crystal semiconductor substrate by irradiating the single crystal semiconductor substrate with an impurity element imparting one conductivity type through the surface of the protective layer. After removing the protective layer, a first electrode is formed over the first impurity semiconductor layer and then an insulating layer is formed over the first electrode.

(3) A first electrode is formed on one surface of a single crystal semiconductor substrate. The single crystal semiconductor substrate is irradiated with an impurity element imparting one conductivity type through a surface of the first electrode, whereby a first impurity semiconductor layer is formed on the one surface of the single crystal semiconductor substrate. Further, an embrittlement layer is formed in a region at a predetermined depth of the single crystal semiconductor substrate by irradiating the single crystal semiconductor substrate with ions through the surface of the first electrode, and then an insulating layer is formed over the first electrode.

(4) A first electrode is formed on one surface of a single crystal semiconductor substrate. An embrittlement layer is formed in a region at a predetermined depth of the single crystal semiconductor substrate by irradiating the single crystal semiconductor substrate with ions through a surface of the first electrode. In addition, the single crystal semiconductor substrate is irradiated with an impurity element imparting one conductivity type through the surface of the first electrode, whereby a first impurity semiconductor layer is formed on the one surface of the single crystal semiconductor substrate. Then, an insulating layer is formed over the first electrode.

Note that in this embodiment, the case (1) is described with reference to FIGS. 3A to 3D.

First, a protective layer 107 is formed on one surface of the single crystal semiconductor substrate 103. Then, an impurity element imparting one conductivity type is added to the single crystal semiconductor substrate 103 by irradiating the single crystal semiconductor substrate 103 with the impurity element through the surface of the protective layer 107, so that the first impurity semiconductor layer 108 is formed (see FIG. 3A).

As the single crystal semiconductor substrate 103, a semiconductor wafer of silicon, germanium, or the like; a compound semiconductor wafer of gallium arsenide, indium phosphide, or the like; or the like can be used. In particular, a single crystal silicon wafer is preferably used. The shape of the single crystal semiconductor substrate 103 is not particularly limited but is desirably rectangular in the case where a supporting substrate to which the single crystal semiconductor substrate 103 is fixed later has a rectangular shape. Further, the surface of the single crystal semiconductor substrate 103 is desirably polished to be a mirror surface.

Figure 9A:
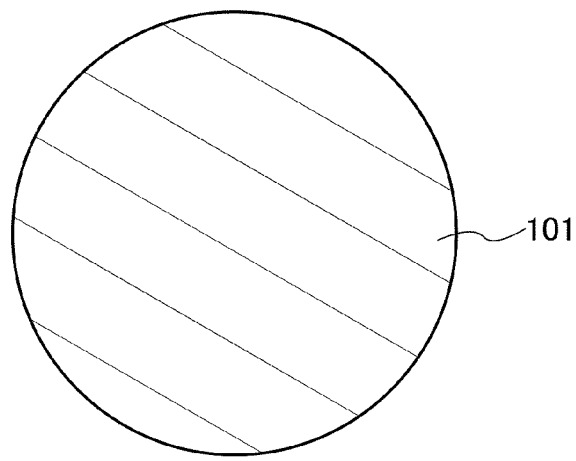
FIGS. 9A to 9C each illustrate a mode of a semiconductor substrate with a predetermined shape cut out from a circular single crystal semiconductor substrate.

Many of single crystal silicon wafers on the market are circular in shape. In those cases, a circular single crystal silicon wafer may be processed to have a rectangular shape or a polygonal shape. For example, as illustrated in FIGS. 9A to 9C, a circular single crystal semiconductor substrate 101 (see FIG. 9A) can be cut out into a single crystal semiconductor substrate 103a with a rectangular shape (see FIG. 9B) or a single crystal semiconductor substrate 103b with a polygonal shape (see FIG. 9C).

Figure 9B:
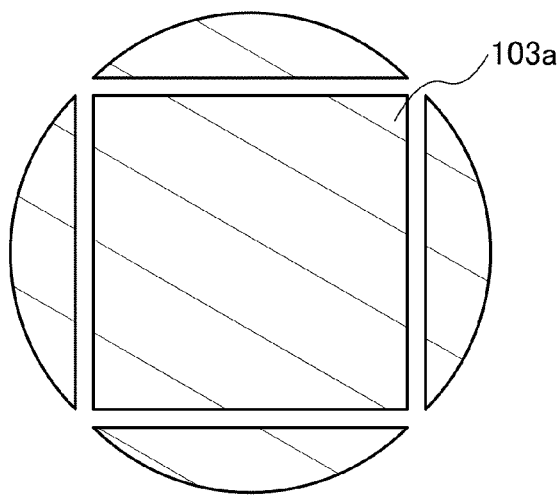
Figure 9C:
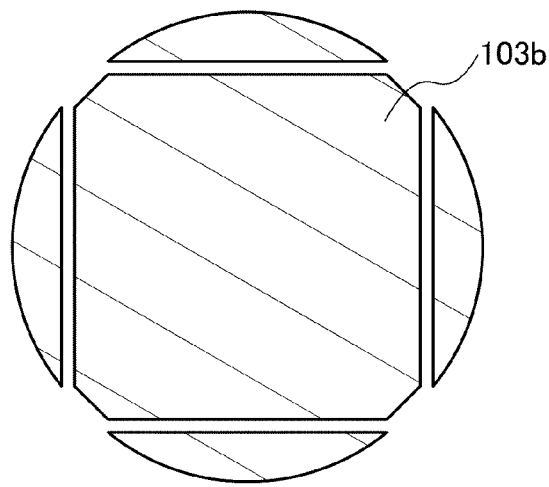

Note that FIG. 9B illustrates the case where the single crystal semiconductor substrate 103a is cut out to have a rectangular shape of maximum size, which is inscribed in the circular single crystal semiconductor substrate 101. Here, the angle of each corner of the single crystal semiconductor substrate 103a is about 90 degrees. FIG. 9C illustrates the case where the single crystal semiconductor substrate 103b is cut out so that the distance between the opposing lines is longer than that of the single crystal semiconductor substrate 103a. In that case, the angle of each corner of the single crystal semiconductor substrate 103b is not 90 degrees and the single crystal semiconductor substrate 103b has not a rectangular shape but a polygonal shape.

As the protective layer 107, silicon oxide or silicon nitride is preferably used. As the manufacturing method, a plasma CVD method, a sputtering method, or the like may be employed. Alternatively, the protective layer 107 may be formed by oxidizing the single crystal semiconductor substrate 103 with oxidizing chemicals or oxygen radicals. Still alternatively, the protective layer 107 may be formed by oxidizing the surface of the single crystal semiconductor substrate 103 by a thermal oxidizing method. By the formation of the protective layer 107, it is possible to prevent the substrate surface from being damaged at the time of forming the embrittlement layer in the single crystal semiconductor substrate 103 or adding an impurity element imparting one conductivity type to the single crystal semiconductor substrate.

The first impurity semiconductor layer 108 is formed by adding an impurity element imparting one conductivity type to the single crystal semiconductor substrate 103. Note that since the protective layer 107 is formed over the single crystal semiconductor substrate 103, an impurity element imparting one conductivity type is added to the single crystal semiconductor substrate 103 through the protective layer 107. Here, the thickness of the first impurity semiconductor layer 108 is from 30 to 150 nm, preferably from 50 to 100 nm.

As the impurity element imparting one conductivity type, boron or the like is used. In that case, the first impurity semiconductor layer 108 having p-type conductivity can be formed. Note that the first impurity semiconductor layer 108 can be formed by a thermal diffusion method. Note that a thermal diffusion method should be performed before the formation of the embrittlement layer because high temperature of about 900° C. or more is applied.

The first impurity semiconductor layer 108 formed by the foregoing method is disposed on the side opposite to the light incident side. Here, in the case of using a p-type substrate as the single crystal semiconductor substrate 103, the first impurity semiconductor layer 108 is a high concentration p-type region. In that case, the high concentration p-type region and a low concentration p-type region are disposed in order on the side opposite to the light incident side, so that a back surface field (BSF) is formed. That is, electrons cannot enter the high concentration p-type region and thus recombination of carriers generated due to photoexcitation can be reduced.

Figure 3A:
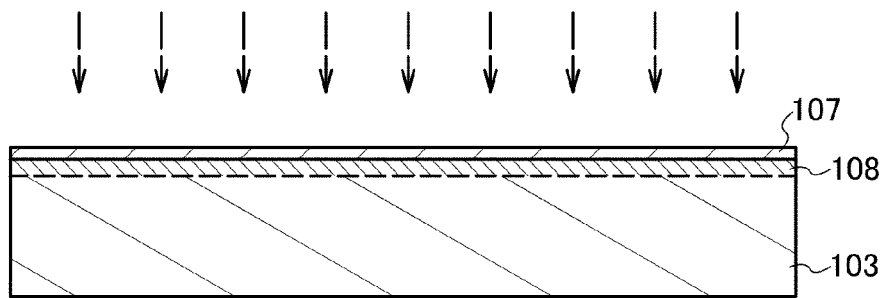
FIGS. 3A to 3D are cross-sectional views illustrating an example of a method for manufacturing a photoelectric conversion device.
Figure 3B:
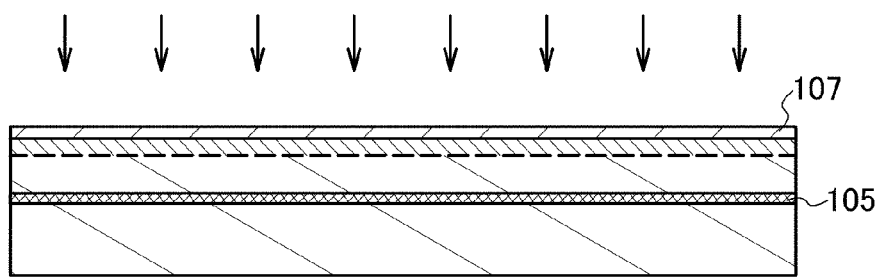

Next, the surface of the protective layer 107 is irradiated with the ions, so that the embrittlement layer 105 is formed in the single crystal semiconductor substrate 103 (see FIG. 3B). Here, as the ions, ions generated using the source gas containing hydrogen (in particular, $H^+$ ions, $H_2^+$ ions, $H_3^+$ ions, or the like) are preferably used. Note that the depth at which the embrittlement layer 105 is formed is controlled by an acceleration voltage at the time of ion irradiation. Further, the thickness of the single crystal semiconductor layer to be separated from the single crystal semiconductor substrate 103 depends on the depth at which the embrittlement layer 105 is formed.

The depth at which the embrittlement layer 105 is formed is 500 nm or less, preferably 400 nm or less, and more preferably from 50 nm to 300 nm from the surface of the single crystal semiconductor substrate 103 (to be exact, a surface of the first impurity semiconductor layer 108). By forming the embrittlement layer 105 at shallower depth, the single crystal semiconductor substrate after the separation remains thicker;

therefore, the number of times of reusing the single crystal semiconductor substrate can be increased. Note that in the case where the embrittlement layer 105 is in a shallow region, since an acceleration voltage is set to be low, the productivity or the like should be considered.

The ion irradiation can be performed using an ion doping apparatus or an ion implantation apparatus. Since mass separation is not performed generally in an ion doping apparatus, even in the case where the single crystal semiconductor substrate 103 is large, an entire surface of the single crystal semiconductor substrate 103 can be evenly irradiated with ions.

Figure 21:
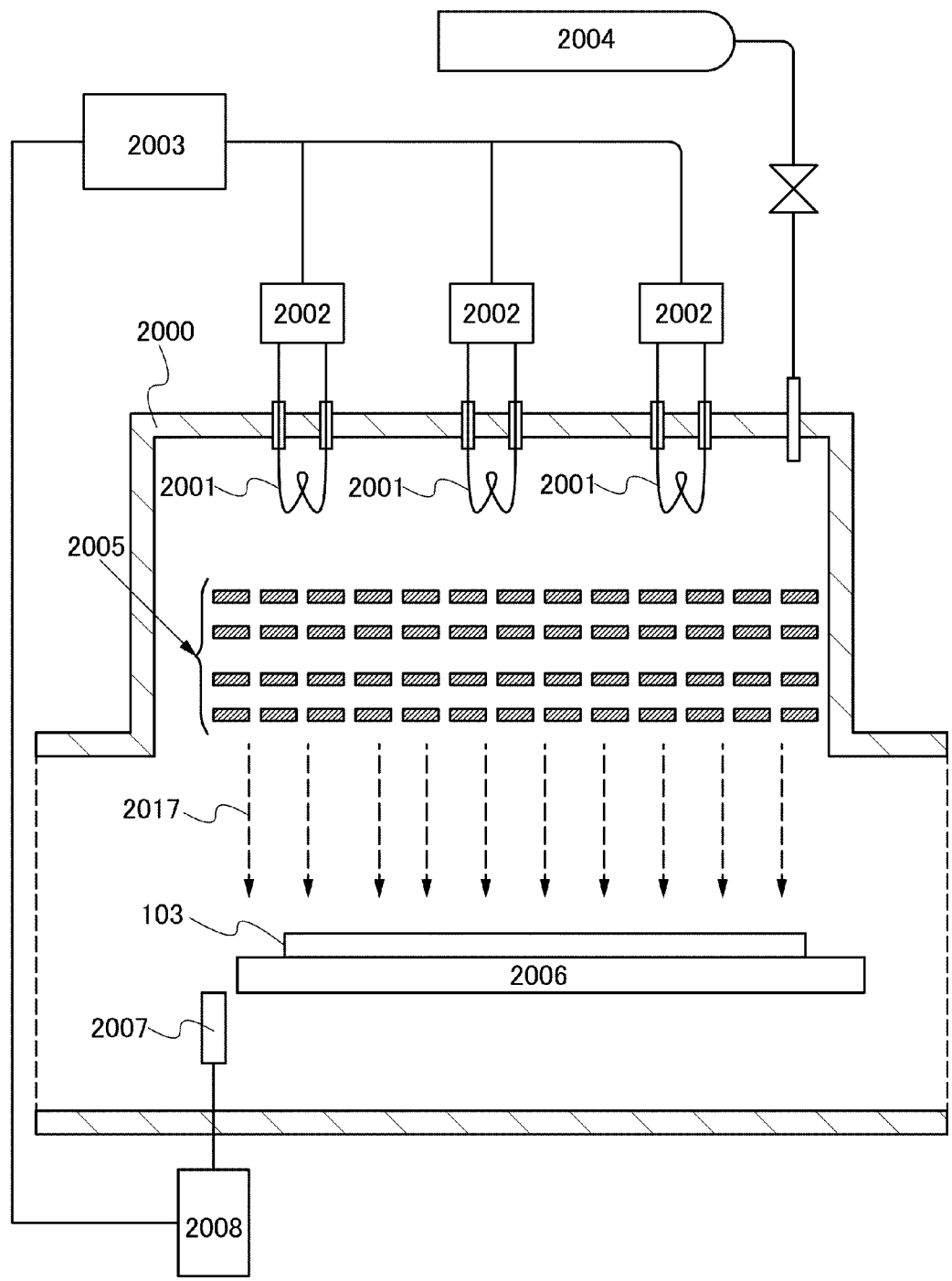
FIG. 21 is a schematic diagram illustrating a structure of an ion doping apparatus.

FIG. 21 illustrates an example of a structure of an ion doping apparatus. A source gas containing hydrogen or the like is supplied from a gas supplying portion 2004 to the ion source 2000. Further, the ion source 2000 is provided with filaments 2001. A filament power source 2002 applies an arc discharge voltage to each filament 2001 to control the amount of current that flows to the filament 2001. The source gas supplied from the gas supplying portion 2004 is exhausted through an exhaustion system.

Hydrogen or the like supplied to the ion source 2000 is ionized by reacting with electrons discharged from the filaments 2001. The ions thus generated are accelerated through an extracting electrode 2005 to form an ion beam 2017. The single crystal semiconductor substrate 103 disposed on a substrate supporting portion 2006 is irradiated with the ion beam 2017. Note that the proportions of the kinds of ions in the ion beam 2017 are measured with a mass spectrometer tube 2007 provided in the vicinity of the substrate supporting portion 2006. The measurement result of the mass spectrometer tube 2007 is converted into signals in a mass spectrometer 2008 and fed back to a power source controller 2003. Accordingly, the proportions of the kinds of ions in the ion beam 2017 are controlled.

Note that since the single crystal semiconductor substrate 103 is irradiated with the ion beam through the first impurity semiconductor layer 108, hydrogenation of the first impurity semiconductor layer 108 can also be performed.

Figure 3C:
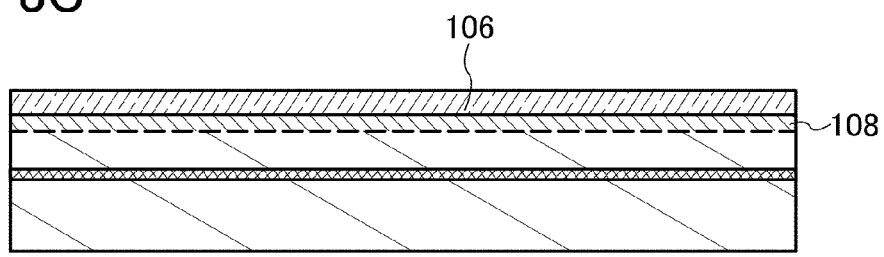

After the embrittlement layer 105 is formed, the protective layer 107 is removed and the first electrode 106 is formed over the first impurity semiconductor layer 108 (see FIG. 3C).

Here, the first electrode 106 needs to resist heat treatment in a subsequent step. Therefore, the first electrode 106 is preferably formed using a refractory metal material. For example, titanium, molybdenum, tungsten, tantalum, chromium, nickel, or the like can be used. Alternatively, a layered structure of any of the foregoing metal materials and a nitride of the metal material may be employed. For example, a layered structure of a titanium nitride layer and a titanium layer, a layered structure of a tantalum nitride layer and a tantalum layer, a layered structure of a tungsten nitride layer and a tungsten layer, or the like can be employed. In the case of the layered structure including a nitride, the nitride is preferably formed in contact with the first impurity semiconductor layer 108. By the formation of the nitride, the first electrode 106 and the first impurity semiconductor layer 108 can have stronger contact with each other. Note that the first electrode 106 is formed by an evaporation method or a sputtering method and the thickness thereof is preferably 100 nm or more.

Figure 3D:
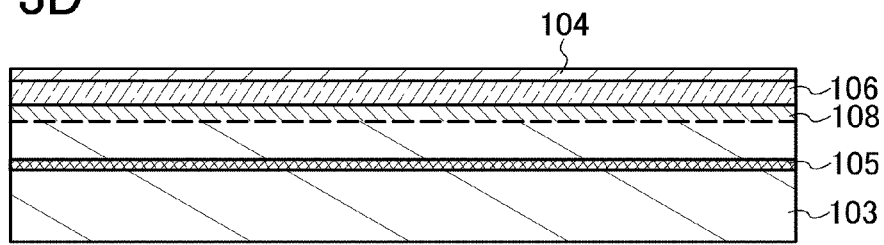

Next, the insulating layer 104 is formed over the first electrode 106 (see FIG. 3D). The insulating layer 104 may have a single-layer structure or a layered structure of two or more layers and in any case, the surface of the insulating layer 104 is preferably highly smooth. In addition, the surface is desirably hydrophilic. For example, a silicon oxide layer, a silicon nitride layer, a silicon oxynitride layer, a silicon nitride oxide layer, or the like can be formed as the insulating layer 104. As a method for forming the insulating layer 104, a CVD method such as a plasma CVD method, a photo CVD method, or a thermal CVD method can be employed. In particular, by employing a plasma CVD method, the insulating layer 104 which is smooth and has an average surface roughness ($R_a$) of 0.5 nm or less (preferably 0.3 nm or less) can be formed.

Here, silicon oxynitride contains larger amount of oxygen than that of nitrogen and contains, for example, oxygen, nitrogen, silicon, and hydrogen at concentrations of 50 to 70 at. %, 0.5 to 15 at. %, 25 to 35 at. %, and 0.1 to 10 at. %, respectively. Further, silicon nitride oxide contains larger amount of nitrogen than that of oxygen and contains, for example, oxygen, nitrogen, silicon, and hydrogen at concentrations of 5 to 30 at. %, 20 to 55 at. %, 25 to 35 at. %, and 10 to 25 at. %, respectively. Note that percentages of oxygen, nitrogen, silicon, and hydrogen fall within the above-described ranges in the case where measurements are performed by Rutherford Backscattering Spectrometry (RBS) or Hydrogen Forward Scattering (HFS). Furthermore, the total of the percentages of the constituent elements does not exceed 100 at. %.

Note that as the insulating layer 104, in particular, a silicon oxide layer formed by a chemical vapor deposition method using organosilane is preferably used. For organosilane, tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), or the like can be used. It is needless to say that silicon oxide, silicon oxynitride, silicon nitride, silicon nitride oxide, or the like may be formed using inorganic silane such as monosilane, disilane, or trisilane.

Further, in the case where the insulating layer 104 has a layered structure, it preferably includes a silicon insulating layer containing nitrogen, such as a silicon nitride layer or a silicon nitride oxide layer. In that case, a semiconductor can be prevented from being contaminated by alkali metal or alkaline earth metal from the supporting substrate 102. Note that the thickness of the insulating layer 104 is preferably from about 5 to about 500 nm.

Note that in the case where the first electrode 106 has a surface with an appropriate smoothness, specifically, in the case where the first electrode 106 has a surface with an average surface roughness ($R_a$) of 0.5 nm or less (preferably, 0.3 nm or less), bonding can be performed without formation of the insulating layer 104 in some cases. In that case, the insulating layer 104 is not necessarily formed.

Figure 4A:
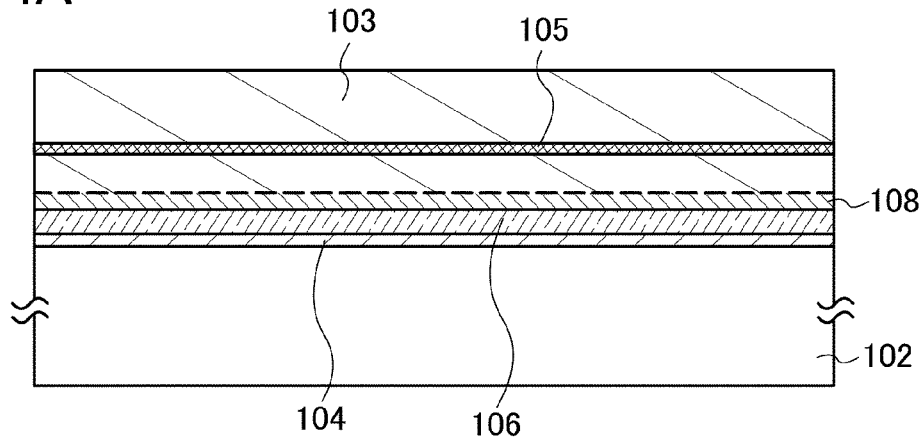
FIGS. 4A to 4C are cross-sectional views illustrating an example of a method for manufacturing a photoelectric conversion device.

Next, pressure is applied to a surface of the insulating layer 104 and a surface of the supporting substrate 102 closely attached to each other, whereby the supporting substrate 102 and the stack including the single crystal semiconductor substrate 103 are bonded to each other (see FIG. 4A).

Before the above bonding, the surfaces to be bonded (here, the one surface of the insulating layer 104 and the one surface of the supporting substrate 102) are cleaned sufficiently. This is because possibility of bonding failure would increase when the surfaces to be bonded include particles such as microscopic dust. Note that in order to reduce bonding failure, the surfaces to be bonded may be activated in advance. For example, one or both of the surfaces to be bonded are irradiated with an atomic beam or an ion beam so that the surfaces to be bonded can be activated. Alternatively, the surfaces to be bonded may be activated by plasma treatment, chemical treatment, or the like. Such activation of the bonding surface facilitates favorable bonding even at a temperature of 400° C. or less.

Note that a structure may be employed in which a silicon insulating layer containing nitrogen, such as a silicon nitride layer or a silicon nitride oxide layer, is formed over the supporting substrate 102 and this stack is closely attached to the insulating layer 104. Also in that case, a semiconductor can be prevented from being contaminated by alkali metal or alkaline earth metal from the supporting substrate 102.

Next, heat treatment is performed to strengthen the bonding. The temperature of the heat treatment should be set so that separation is not promoted along the embrittlement layer 105. For example, the temperature is set to lower than 400° C., preferably 300° C. or lower. Heat treatment time is not particularly limited and may be optimally set as appropriate depending on the relation between processing speed and bonding strength. For example, heat treatment at about 200° C. for about two hours can be employed. Here, by irradiating only a region to be bonded with microwave, local heat treatment may be performed. Note that in the case where there is no problem in bonding strength, the heat treatment may be omitted.

Figure 4B:
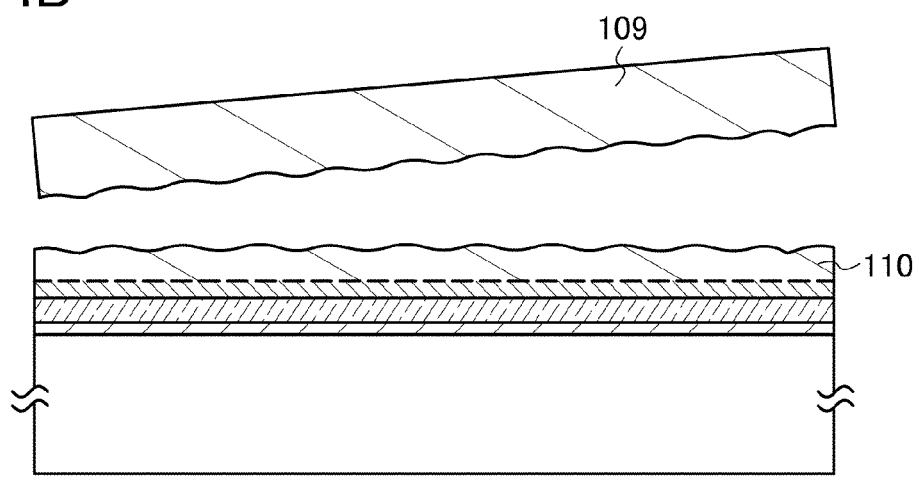

Next, the single crystal semiconductor substrate 103 is separated along the embrittlement layer 105 into the separation substrate 109 and the first single crystal semiconductor layer 110 (see FIG. 4B). The separation of the single crystal semiconductor substrate 103 is performed by heat treatment. The temperature for the heat treatment can be set based on the upper temperature limit of the supporting substrate 102. For example, in the case where a glass substrate is used as the supporting substrate 102, heat treatment is preferably performed at a temperature of from 400° C. to 650° C. Note that heat treatment may be performed at a temperature of from 400° C. to 700° C. as long as being performed in a short time. It is needless to say that in the case where the upper temperature limit of the glass substrate is higher than 700° C., the temperature for the heat treatment may be set to higher than 700° C.

By performing the heat treatment as described above, the volume of microvoids formed in the embrittlement layer 105 is changed, and then the embrittlement layer 105 is cracked. As a result, the single crystal semiconductor substrate 103 is separated along the embrittlement layer 105. Since the insulating layer 104 is bonded to the supporting substrate 102, the first single crystal semiconductor layer 110 separated from the single crystal semiconductor substrate 103 remains on the supporting substrate 102. Further, since the bonding interface between the supporting substrate 102 and the insulating layer 104 is heated by this heat treatment, a covalent bond is formed at the bonding interface, so that the strength of the bonding between the supporting substrate 102 and the insulating layer 104 is further increased.

Note that the total thickness of the first single crystal semiconductor layer 110 and the first impurity semiconductor layer 108 substantially corresponds to the depth at which the embrittlement layer 105 is formed, which is 500 nm or less, preferably 400 nm or less, and more preferably 50 nm or more and 300 nm or less.

Through the foregoing steps, the first single crystal semiconductor layer 110 fixed to the supporting substrate 102 can be obtained. Note that the separation substrate 109 can be reused after a recycling process. The separation substrate 109 that has been subjected to the recycling process may be reused as a substrate from which a single crystal semiconductor layer is separated (corresponding to the single crystal semiconductor substrate 103 in this embodiment), or may be used for any other purpose. In the case where the separation substrate 109 which has been subjected to the recycling process is reused as a single crystal semiconductor substrate from which a single crystal semiconductor layer is separated, a plurality of photoelectric conversion devices can be manufactured from a piece of single crystal semiconductor substrate.

Figure 4C:
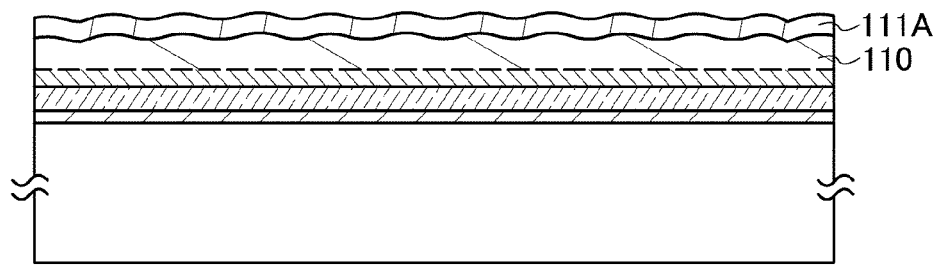

Next, the first semiconductor layer 111A is formed over the first single crystal semiconductor layer 110 (see FIG. 4C). For example, the first semiconductor layer 111A is formed by a vapor phase growth (vapor phase epitaxial growth) method (see FIG. 4C). In that case, the first semiconductor layer 111A is affected by crystallinity of the first single crystal semiconductor layer 110. Here, the first semiconductor layer 111A may be formed using a material selected depending on the material of the first single crystal semiconductor layer 110. In the case where a silicon layer is formed as the first semiconductor layer 111A, it can be formed by a plasma CVD method using a mixed gas of a silane based gas (typically silane) and hydrogen as a source gas. Further, the first semiconductor layer 111A may be formed to a thickness of from about 10 nm to about 100 nm (preferably, from 10 nm to 50 nm).

The source gas is a mixed gas in which a flow ratio of hydrogen to a silane based gas is 50:1 or more (preferably, 100:1 or more). For example, a mixture of 4 sccm of silane ($SiH_4$) and 400 sccm of hydrogen may be used. By increasing a flow rate of hydrogen, a semiconductor layer with higher crystallinity can be formed. Accordingly, hydrogen content in the semiconductor layer can be reduced.

Note that silane is not necessarily used as the silane based gas and disilane ($Si_2H_6$) or the like may alternatively be used. Further, a rare gas may be added to the source gas.

Other conditions at the time of forming the first semiconductor layer 111A by a plasma CVD method are as follows: the frequency is 10 to 200 MHz, the power is from 5 W to 50 W, the pressure in a chamber is from 10 Pa to $10^3$ Pa, the distance between electrodes (in the case of a parallel plate type) is from 15 mm to 30 mm, and the temperature of the supporting substrate 102 is from 200° C. to 400° C., and the frequency, the power, the pressure in a chamber, the distance between electrodes (in the case of a parallel plate type), and the temperature of the supporting substrate 102 are typically 60 MHz, 15 W, 100 Pa, 20 mm, and 280° C., respectively. Note that the foregoing deposition conditions are only an example and the disclosed embodiment of the invention is not limited thereto. Here, the important point is that a semiconductor layer with high crystallinity (or a semiconductor layer with low hydrogen concentration or a semiconductor layer with low hydrogen content) is formed as the first semiconductor layer 111A. Therefore, the first semiconductor layer 111A may be formed by any method as long as this purpose is achieved.

Note that before the epitaxial growth of the first semiconductor layer 111A is performed, a native oxide layer or the like formed on a surface of the first single crystal semiconductor layer 110 is preferably removed. This is because in the case where an oxide layer is on the surface of the first single crystal semiconductor layer 110, the epitaxial growth affected by crystallinity of the first single crystal semiconductor layer 110 cannot be promoted and thus crystallinity of the first semiconductor layer 111A is degraded. Here, the oxide layer can be removed using a solution containing fluorinated acid.

Figure 5A:
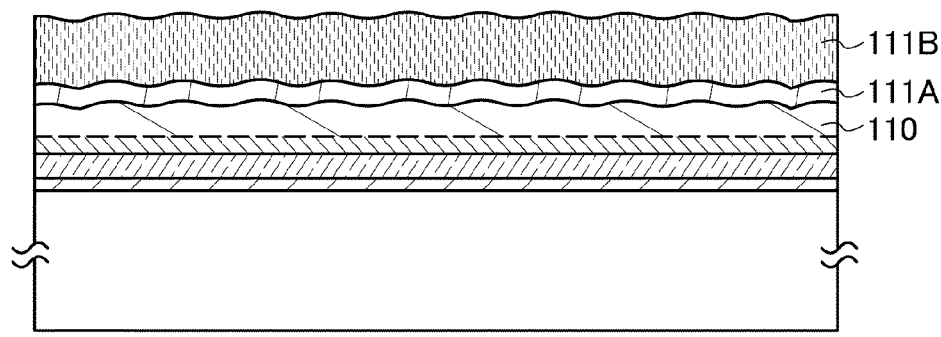
FIGS. 5A to 5C are cross-sectional views illustrating an example of a method for manufacturing a photoelectric conversion device.

Next, the second semiconductor layer 111B is formed over the first semiconductor layer 111A (see FIG. 5A). Here, the second semiconductor layer 111B is formed using a material selected depending on the material of the first semiconductor layer 111A. Further, the second semiconductor layer 111B is formed to a thickness of 200 nm or more (preferably, 400 nm or more). Also in that case, an oxide layer formed on the surface of the first semiconductor layer 111A is preferably removed in advance.

The second semiconductor layer 111B has lower crystallinity than the first semiconductor layer 111A. Alternatively, the second semiconductor layer 111B has higher hydrogen concentration (higher hydrogen content) than the first semiconductor layer 111A. As the second semiconductor layer 111B, for example, an amorphous semiconductor layer may be formed.

Although the second semiconductor layer 111B may be formed by any method, it is preferably formed under the condition that the deposition rate is higher than at least that of the first semiconductor layer 111A. For example, in the case where the second semiconductor layer 111B is formed by a plasma CVD method using a mixed gas of a silane based gas (typically silane) and a hydrogen gas as a source gas, a flow ratio of a hydrogen gas to a silane based gas may be from 2:1 to 20:1 (preferably, from 5:1 to 15:1). Further, other deposition conditions are preferably as follows: the frequency is from 10 MHz to 200 MHz, the power is from 5 W to 50 W, the pressure in a chamber is from 10 Pa to $10^3$ Pa, the distance between electrodes (in the case of a parallel plate type) is from 15 mm to 30 mm, and the temperature of the supporting substrate 102 is from 200° C. to 400° C. Typically, the flow rate of silane ($SiH_4$) is 25 sccm, the flow rate of hydrogen is 150 sccm, the frequency is 27 MHz, the power is 30 W, the pressure is 66.6 Pa, the distance between electrodes is 25 mm, and the substrate temperature is 280° C. Note that the foregoing deposition conditions are only an example and the disclosed embodiment of the invention is not limited thereto. Here, the important point is that a semiconductor layer even with low crystallinity (or high hydrogen concentration) is formed at a high deposition rate as the second semiconductor layer 111B. Therefore, the second semiconductor layer 111B may be formed by any method as long as this purpose is achieved.

Figure 5B:
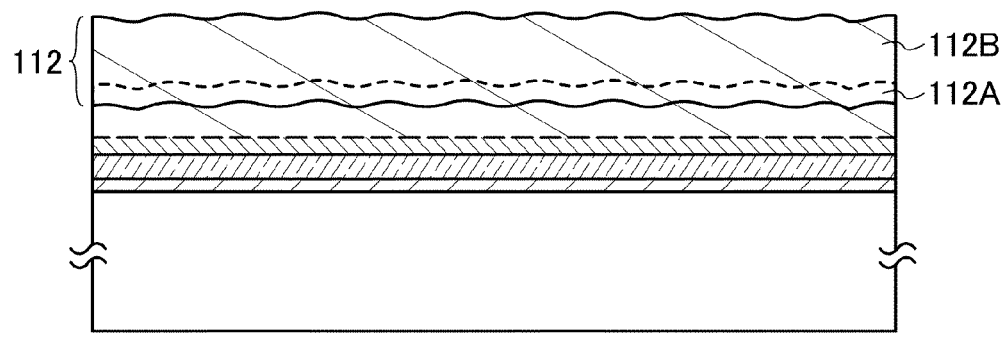

After that, heat treatment is performed to form the second single crystal semiconductor layer 112 through solid phase growth (solid phase epitaxial growth) (see FIG. 5B). Note that the first semiconductor layer 111A and the second semiconductor layer 111B correspond to the lower layer region 112A and the upper layer region 112B of the second single crystal semiconductor layer 112, respectively.

The heat treatment can be performed using a heat treatment apparatus such as rapid thermal annealing (RTA), a furnace, a millimeter wave heating apparatus, or the like. As a heating method of the heat treatment apparatus, a resistance heating method, a lamp heating method, a gas heating method, a radio wave heating method, and the like can be given. Alternatively, laser beam irradiation or thermal plasma jet irradiation may be performed.

In general, a furnace is an external heating method, and the inside of a chamber and an object to be processed are in a thermal equilibrium state. On the other hand, RTA is to perform instantaneous heating (rapid heating) by directly giving energy to an object to be processed so that the inside of a chamber and the object to be processed are in a thermal non-equilibrium state. As the RTA apparatus, an RTA apparatus employing a lamp heating method (lamp rapid thermal annealing (LRTA) apparatus), an RTA apparatus employing a gas heating method using a heated gas (gas rapid thermal annealing (GRTA) apparatus), an RTA apparatus employing both a lamp heating method and a gas heating method, and the like can be given.

In the case where an RTA apparatus is used for the heat treatment, it is preferable that the process temperature be 500° C. or more and 750° C. or less and the process time be 0.5 minutes or more and 10 minutes or less. In the case where a furnace is used for the heat treatment, it is preferable that the process temperature be 500° C. or more and 650° C. or less and the process time be 1 hour or more and 4 hours or less.

As described above, the stack of the first single crystal semiconductor layer 110 and the second single crystal semiconductor layer 112 is formed. Here, in consideration of photoelectric conversion efficiency, the single crystal semiconductor layer with a thickness of 800 nm or more is required for a photoelectric conversion device. Therefore, for example, in the case where the thickness of the first single crystal semiconductor layer 110 is 300 nm, the thickness of the second single crystal semiconductor layer 112 is preferably at least 500 nm. Here, it is not preferable that only a vapor phase epitaxial growth method is used to form the second single crystal semiconductor layer 112 with a thickness of 500 nm or more in terms of the deposition rate. On the other hand, in the case where the second single crystal semiconductor layer 112 is formed using only a solid phase epitaxial growth method, there occurs a problem in that the semiconductor layer is peeled due to heat treatment or the like at the time of solid phase growth (solid phase epitaxial growth). This is attributed to the fact that the semiconductor layer (for example, an amorphous semiconductor layer) which has just formed contains a large amount of hydrogen.

In this embodiment, the second single crystal semiconductor layer 112 including the lower layer region 112A formed from the first semiconductor layer 111A and the upper layer region 112B formed from the second semiconductor layer 111B is formed as follows: after the first semiconductor layer 111A is formed thinly by vapor phase growth (vapor phase epitaxial growth), the second semiconductor layer 111B is formed thickly by vapor phase growth (vapor phase epitaxial growth) under the condition different from that of vapor phase growth for forming the first semiconductor layer 111A, and then solid phase growth (solid phase epitaxial growth) is performed. Accordingly, it is possible to solve the problem of peeling of the semiconductor layer with the deposition rate being sufficiently high. That is, the single crystal semiconductor layer can be formed with high productivity and high yield.

Note that the problem of peeling can be reduced by forming the stack of the semiconductor layer with high crytallinity and the semiconductor layer with low crystallinity over the single crystal semiconductor layer and then performing solid phase growth as described in this embodiment, because difference in crystallinity between adjacent layers is reduced, whereby bonding strength of atoms at the interface is higher and thus the adjacent layers have stronger contact with each other.

Although a semiconductor layer with high crystallinity (the first semiconductor layer 111A) is formed between a single crystal semiconductor layer (the first single crystal semiconductor layer 110) and a semiconductor layer with low crystallinity (the second semiconductor layer 111B) in this embodiment, the disclosed embodiment of the invention is not limited thereto in view of the foregoing reason. That is, a plurality of semiconductor layers with different crystallinity may be provided between the single crystal semiconductor layer and the semiconductor layer with low crystallinity. For example, a semiconductor layer with high crystallinity, a semiconductor layer with slightly high crystallinity, and a semiconductor layer with low crystallinity are formed in this order over the single crystal semiconductor layer. With such a structure, contact strength of the layers can be increased.

In the interest of contact strength at the interface, the foregoing stack is preferably formed so as not to be exposed to air as much as possible. For example, it is preferable that the first semiconductor layer 111A and the second semiconductor layer 111B be sequentially deposited in one chamber.

Figure 5C:
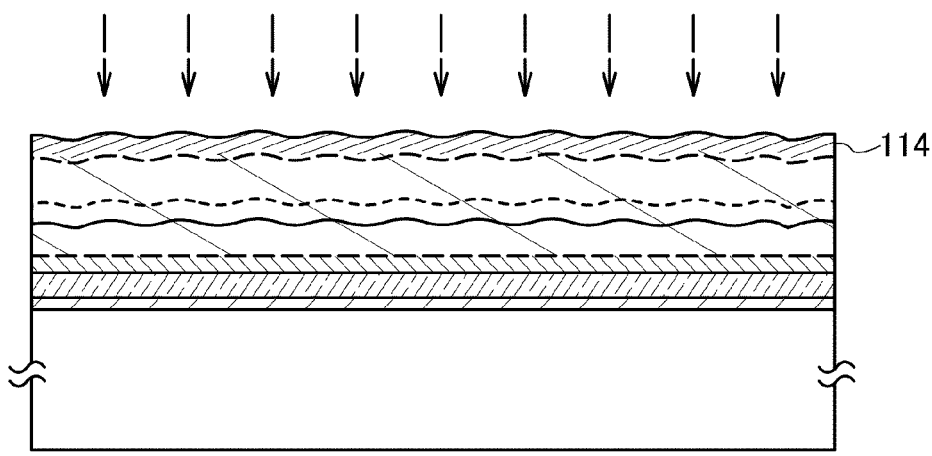

Next, an impurity element imparting a conductivity type opposite to that of the first impurity semiconductor layer 108 is added through the one surface of the second single crystal semiconductor layer 112 (the surface which is not in contact with the first single crystal semiconductor layer 110), whereby the second impurity semiconductor layer 114 is formed (see FIG. 5C). For example, phosphorus or arsenic is added as the impurity element, whereby the second impurity semiconductor layer 114 having n type conductivity is formed. In the case where the supporting substrate 102 is a glass substrate, the substrate cannot resist process temperature in a thermal diffusion method; therefore, the impurity element is added by ion implantation or ion doping.

Figure 13A:
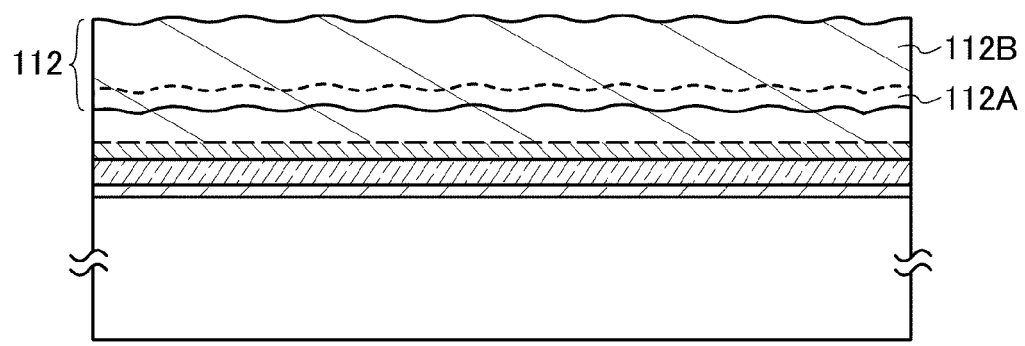
FIGS. 13A and 13B are cross-sectional views illustrating an example of a method for manufacturing a photoelectric conversion device.
Figure 13B:
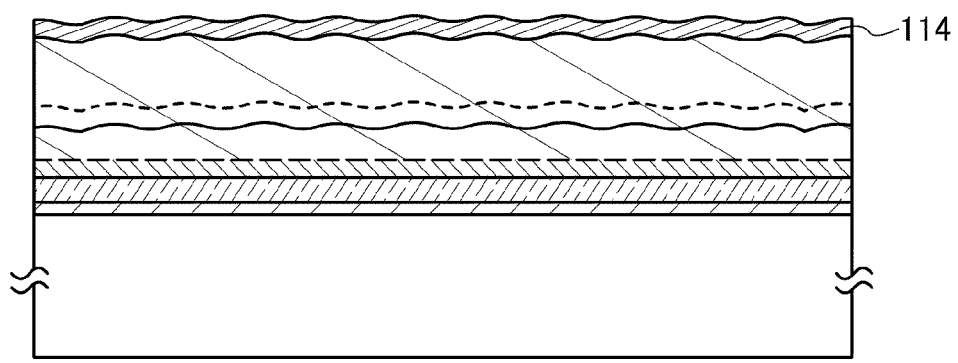

Alternatively, the second impurity semiconductor layer 114 may be formed using an amorphous semiconductor, over the second single crystal semiconductor layer 112 (see FIGS. 13A and 13B). Using amorphous semiconductor for the second impurity semiconductor layer 114 does not cause a significant problem because a region mainly functioning as a photoelectric conversion layer is formed using the single crystal semiconductor layer.

Note that the thickness of the second impurity semiconductor layer 114 is preferably about 20 nm to 200 nm, more preferably 50 nm to 100 nm. By forming the second impurity semiconductor layer 114 thinly, recombination of carriers in the second impurity semiconductor layer 114 can be prevented.

In this manner, the unit cell 120 can be obtained in which the first impurity semiconductor layer 108 having one conductivity type, the first single crystal semiconductor layer 110, the second single crystal semiconductor layer 112, and the second impurity semiconductor layer 114 having a conductivity type opposite to the one conductivity type are stacked in order.

Figure 6A:
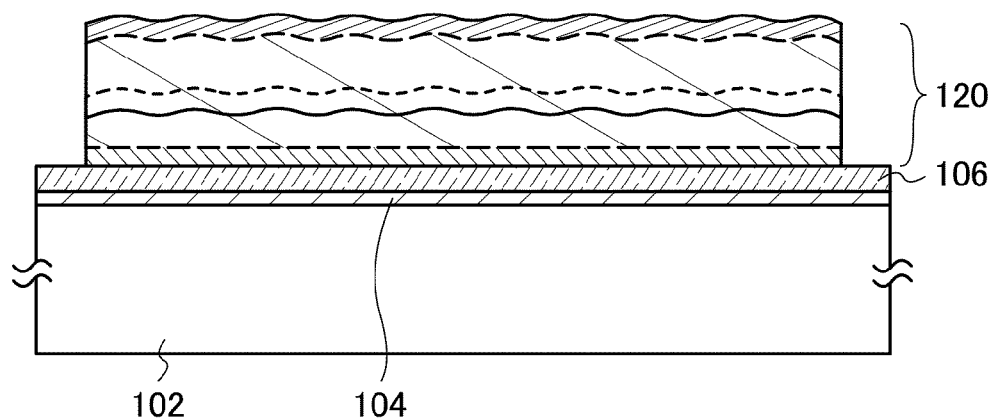
FIGS. 6A and 6B are cross-sectional views illustrating an example of a method for manufacturing a photoelectric conversion device.

After that, the first impurity semiconductor layer 108, the first single crystal semiconductor layer 110, the second single crystal semiconductor layer 112, and the second impurity semiconductor layer 114 which are provided over the first electrode 106 are selectively etched to expose a part of the first electrode 106 (preferably an end portion of the first electrode 106) (see FIG. 6A).

Here, the purpose of exposing a part of the first electrode 106 is to form an auxiliary electrode (or an auxiliary wiring) later. In order that the photoelectric conversion device may function, it is required that electric energy can be extracted from electrodes corresponding to a positive electrode and a negative electrode. However, since an upper portion of the first electrode 106 is covered with the single crystal semiconductor layer and the supporting substrate 102 is provided below the first electrode, electric energy is difficult to be extracted in this structure. To solve such a problem, a part of the layers over the first electrode 106 is etched to expose a part of the first electrode 106 and to form an auxiliary electrode (or an auxiliary wiring) which can be led.

In specific, the etching may be performed using a resist or an insulating layer such as a silicon nitride layer over the second impurity semiconductor layer 114 as a mask. The etching may be performed by dry etching with use of a fluorine based gas such as $NF_3$ or $SF_6$ under the condition in which at least the etching selectivity ratio of the layers (the first impurity semiconductor layer 108, the first single crystal semiconductor layer 110, the second single crystal semiconductor layer 112, and the second impurity semiconductor layer 114) formed over the first electrode 106 to the first electrode 106 is sufficiently high. Note that after the etching, the mask is removed because it is no longer necessary.

Although the example in which the first electrode 106 is exposed after the formation of the second impurity semiconductor layer 114 is described in this embodiment, the second impurity semiconductor layer 114 may be formed after the exposure of the first electrode 106.

Figure 6B:
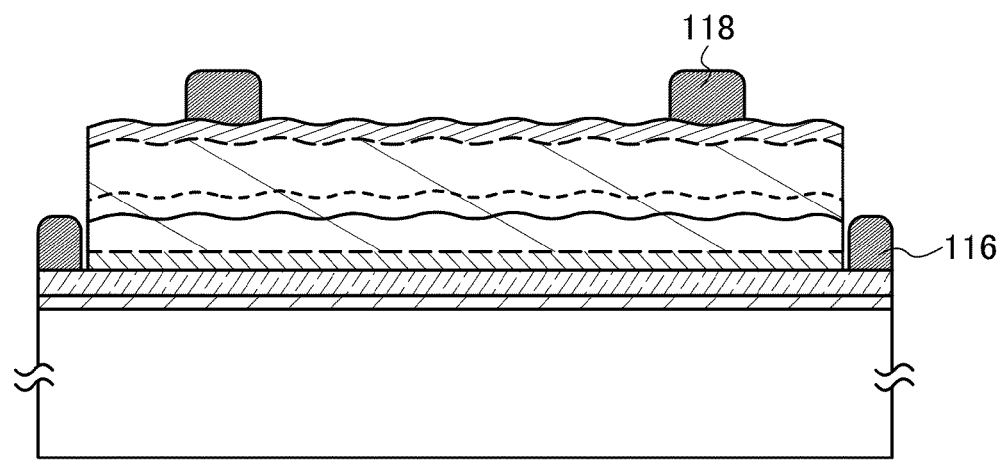

Next, the auxiliary electrode 116 in contact with the exposed part of the first electrode 106 and the second electrode 118 over the second impurity semiconductor layer 114 are formed (see FIG. 6B).

The auxiliary electrode 116 is provided to facilitate extraction of electric energy converted from light. That is, the auxiliary electrode 116 functions as an extracting electrode (also referred to as a collecting electrode).

The second electrode 118 is formed to have a grid shape (or a comb-like shape or a pectinate shape) as seen from above, as shown in FIG. 2. Thus, the unit cell 120 can be irradiated with enough light and light absorption efficiency of the unit cell 120 can be increased. The shape of the second electrode 118 is not particularly limited; however, it is needless to say that the smaller the area of the second electrode 118 over the unit cell 120 (the second impurity semiconductor layer 114) is, the higher light absorption efficiency is. Note that the second electrode 118 can be formed in the same step as the auxiliary electrode 116.

The auxiliary electrode 116 and the second electrode 118 may be each formed by a printing method or the like using aluminum, silver, lead-tin (solder), or the like. For example, the auxiliary electrode 116 and the second electrode 118 can be formed using a silver paste by a screen printing method.

Thus, the photoelectric conversion device 100 can be manufactured.

Figure 8:
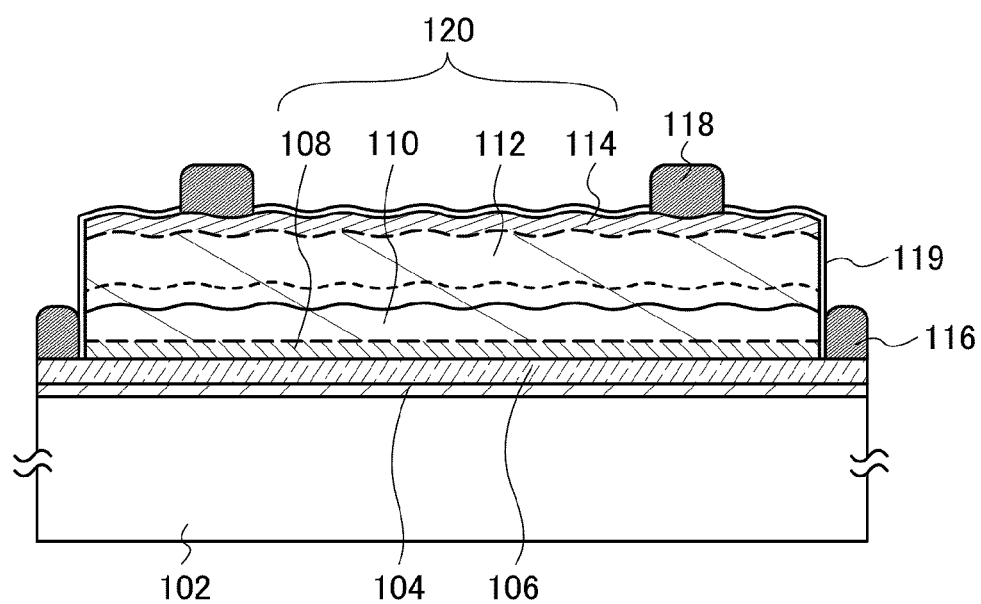
FIG. 8 is a cross-sectional view illustrating an example of a photoelectric conversion device.

Note that a passivation layer 119 which has an antireflection function is preferably formed over the unit cell 120 (see FIG. 8).

For the passivation layer 119, a material whose refractive index is between the refractive indices of air and incident surface of the unit cell 120 (in this embodiment, the second impurity semiconductor layer 114) is used. Alternatively, a material which transmits light with a predetermined wavelength is used so that light incidence to the unit cell 120 is not interrupted. By using such a material, reflection at the light incident surface of the unit cell 120 can be prevented. Note that as such a material, silicon nitride, silicon nitride oxide, magnesium fluoride, and the like can be given.

The passivation layer 119 is provided between the auxiliary electrode 116 and the unit cell 120 and between the second electrode 118 and the unit cell 120. For example, after the passivation layer 119 is formed over the unit cell 120, the passivation layer 119 is etched to expose a part of the second impurity semiconductor layer 114 and a part of the first electrode 106. Then, the auxiliary electrode 116 in contact with the first electrode 106 and the second electrode 118 in contact with the second impurity semiconductor layer 114 are formed. Note that the passivation layer 119 provided with openings may be formed by a lift-off method or the like.

Figure 7A:
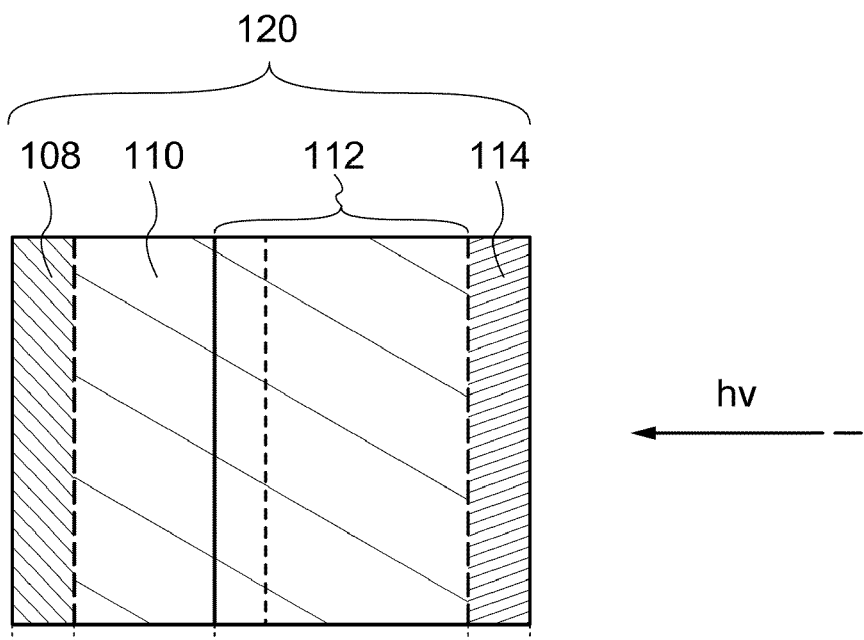
FIG. 7A is a cross-sectional view illustrating a unit cell of a photoelectric conversion device and FIG. 7B is an energy band diagram corresponding to the unit cell of the photoelectric conversion device.

FIG. 7A illustrates an example of a cross-sectional schematic view of the unit cell 120 of the photoelectric conversion device. Here, the structure is illustrated in which the first impurity semiconductor layer 108 to which a p-type impurity element is added at high concentration (p+ layer), the p-type first single crystal semiconductor layer 110 (p layer), the i-type second single crystal semiconductor layer 112 (i layer), and the second impurity semiconductor layer 114 to which an n-type impurity element is added (n+ layer or n layer) are provided in order; however, the disclosed embodiment of the invention is not limited thereto. Note that in the case where the single crystal semiconductor layer in the unit cell 120 is single crystal silicon, the band-gap energy of the single crystal semiconductor layer is about 1.12 eV. Further, light (energy: hv) enters from the second impurity semiconductor layer 114 side.

Figure 7B:
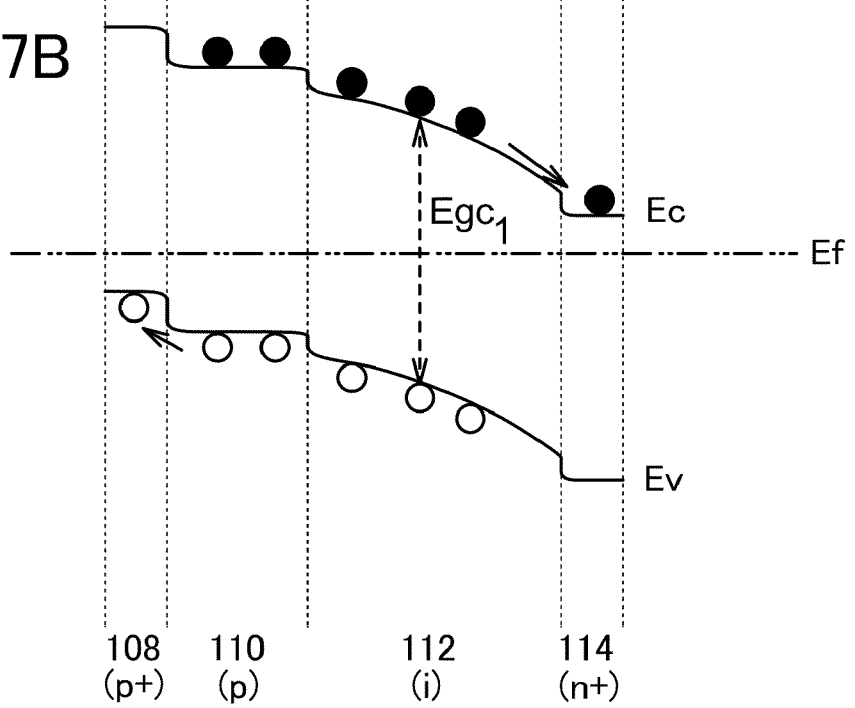

FIG. 7B illustrates an energy band diagram of the unit cell 120 in FIG. 7A. Here, $E_c$ indicates a bottom of a conduction band, $E_v$ indicates a top of a valence band, and $E_f$ indicates Fermi level. Further, $E_{gc1}$ indicates the band-gap energy of the first single crystal semiconductor layer 110 and the second single crystal semiconductor layer 112.

According to the band structure illustrated in FIG. 7B, electrons generated by optical excitation flow in the direction of the n+ layer (or the n layer), whereas holes generated by optical excitation flow in the direction of the p+ layer. This is a basic principle of photoelectric conversion. Here, it is important to increase the number of carriers generated by optical excitation in order to increase efficiency in photoelectric conversion. To increase carriers generated by optical excitation, a light absorption layer (in this embodiment, the single crystal semiconductor layer) may have an appropriate thickness. In the case of using single crystal silicon for the light absorption layer, the thickness thereof may be 800 nm or more (preferably, 1000 nm or more) based on the light absorption coefficient of single crystal silicon and the spectrum of sunlight.

From this viewpoint, in this embodiment, the thickness of the single crystal semiconductor layer can be increased by utilizing an epitaxial growth technique, and the total thickness of the first single crystal semiconductor layer 110 and the second single crystal semiconductor layer 112 is 800 nm or more. Therefore, enough carriers can be generated in the single crystal semiconductor layer and thus photoelectric conversion efficiency can be increased.

As described above, with an epitaxial growth technique described in this embodiment, the single crystal semiconductor layer with a thickness of 800 nm or more, preferably 1000 nm or more which functions as a photoelectric conversion layer can be obtained. By the epitaxial growth technique, the consumption of single crystal semiconductor can be suppressed as compared to the case of using a bulk single crystal semiconductor substrate. Note that a portion supporting the photoelectric conversion device has been conventionally formed using a single crystal semiconductor. However, by using a single crystal semiconductor layer separated as a thin slice from a single crystal semiconductor substrate, the consumption of single crystal semiconductor can be significantly suppressed. Further, the single crystal semiconductor substrate from which the single crystal semiconductor layer has been separated can be reused repeatedly; therefore, the resources can be effectively used.

Further, in this embodiment, the second single crystal semiconductor layer is formed using the stack of the first semiconductor layer with high crystallinity (low hydrogen concentration, low hydrogen content) and the second semiconductor layer with low crystallinity (high hydrogen concentration, high hydrogen content). Accordingly, even in the case where the second single crystal semiconductor layer is formed to be thick, the second single crystal semiconductor layer can be prevented from being peeled. That is, it is possible to prevent the second single crystal semiconductor layer from being peeled due to increase in thickness while the second single crystal semiconductor layer has an enough thickness to increase productivity; therefore, the photoelectric conversion layer with a required thickness can be formed efficiently with high yield by using only a minimal amount of materials.

This embodiment can be combined with any of the other embodiments as appropriate.

Embodiment 2

This embodiment describes an example of a method for manufacturing a photoelectric conversion device, which is different from that in the foregoing embodiment. Specifically, although the foregoing embodiment describes, taking (1) as an example, the formation order of the embrittlement layer 105, the first impurity semiconductor layer 108, the first electrode 106, and the insulating layer 104, this embodiment describes examples (2) to (4). Note that a manufacturing process other than the formation order of the embrittlement layer 105, the first impurity semiconductor layer 108, the first electrode 106, and the insulating layer 104 is similar to that of the foregoing embodiment; therefore, the description thereof is omitted.

The example (2) is described below with reference to FIGS. 10A to 10D.

First, the protective layer 107 is formed on one surface of the single crystal semiconductor substrate 103. Then, the single crystal semiconductor substrate 103 is irradiated with ions through the surface of the protective layer 107, so that the embrittlement layer 105 is formed in the single crystal semiconductor substrate 103 (see FIG. 10A).

Figure 10A:
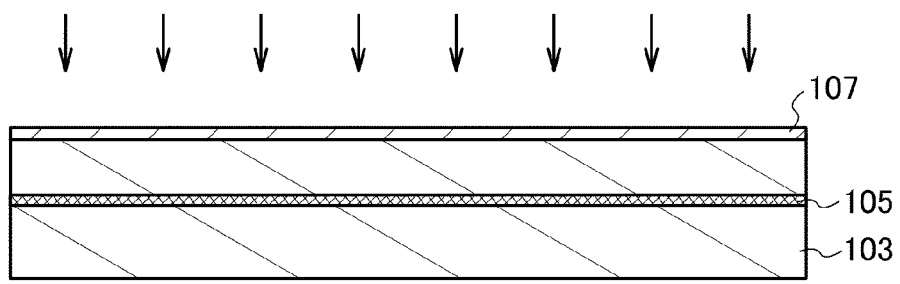
FIGS. 10A to 10D are cross-sectional views illustrating an example of a method for manufacturing a photoelectric conversion device.
Figure 10B:
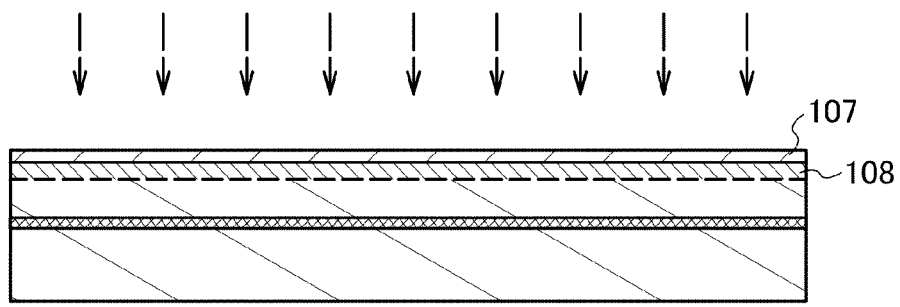
Figure 10C:
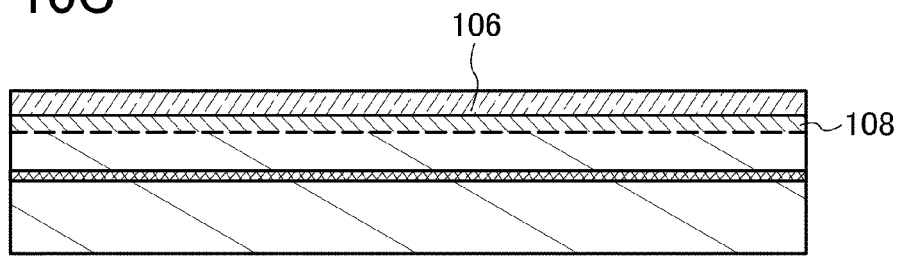

Next, the first impurity semiconductor layer 108 is formed by irradiating the single crystal semiconductor substrate 103 with an impurity element imparting one conductivity type through a surface of the protective layer 107 to add the impurity element to the single crystal semiconductor substrate 103 (see FIG. 10B). Note that, here, since the embrittlement layer 105 has already been formed, the addition of the impurity element is preferably performed by an ion implantation method or an ion doping method. This is because in the case of employing a method utilizing high temperature processing, such as a thermal diffusion method, there is a high possibility that the single crystal semiconductor substrate 103 be separated along the embrittlement layer 105.

Figure 10D:
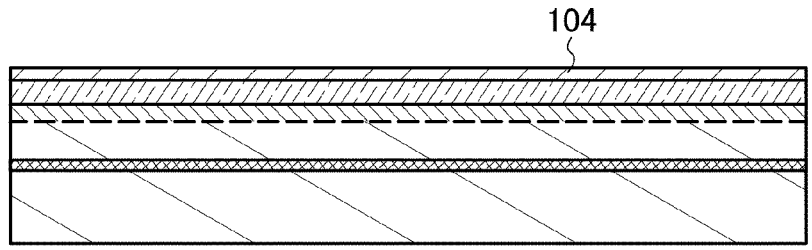

After that, the protective layer 107 is removed and the first electrode 106 is formed (see FIG. 10C), and then the insulating layer 104 is formed over the first electrode 106 (see FIG. 10D). The manufacturing process following this step is the same as that of the foregoing embodiment.

Thus, in the example (2), the single crystal semiconductor substrate to which an impurity element is not added is irradiated with the ions to form the embrittlement layer; therefore, variation in the embrittlement layer can be reduced.

The example (3) is described below with reference to FIGS. 11A to 11D.

Figure 11A:
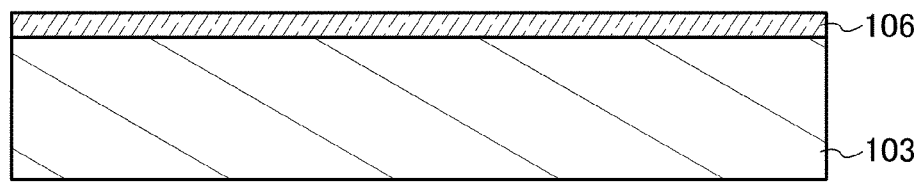
FIGS. 11A to 11D are cross-sectional views illustrating an example of a method for manufacturing a photoelectric conversion device.

First, the first electrode 106 is formed on one surface of the single crystal semiconductor substrate 103 (see FIG. 11A).

Figure 11B:
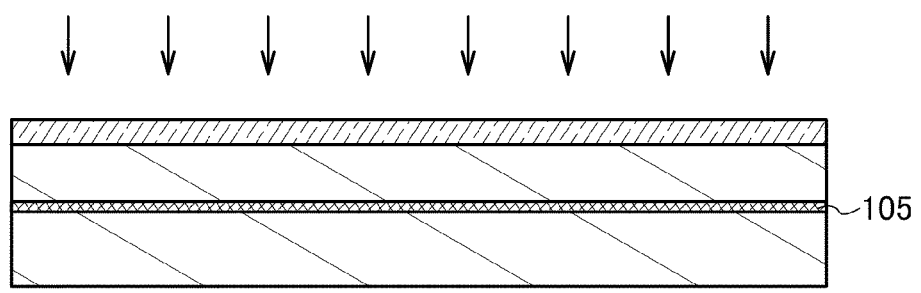

Next, the single crystal semiconductor substrate 103 is irradiated with ions through a surface of the first electrode 106 to form the embrittlement layer 105 in the single crystal semiconductor substrate 103 (see FIG. 11B).

Figure 11C:
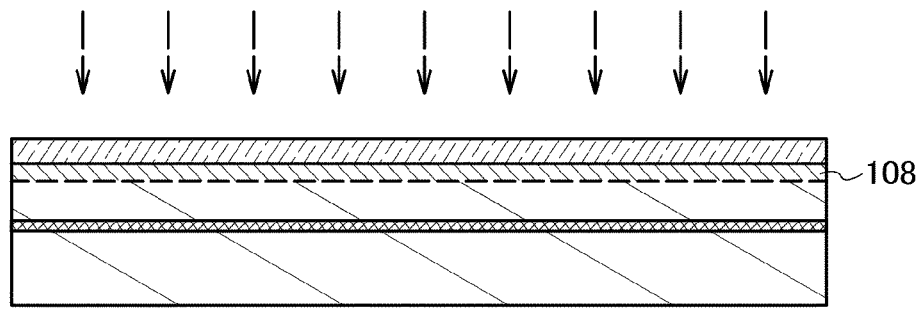

Then, the first impurity semiconductor layer 108 is formed by irradiating the single crystal semiconductor substrate 103 with an impurity element imparting one conductivity type through the surface of the first electrode 106 to add the impurity element imparting one conductivity type to the single crystal semiconductor substrate 103 (see FIG. 11C).

Figure 11D:
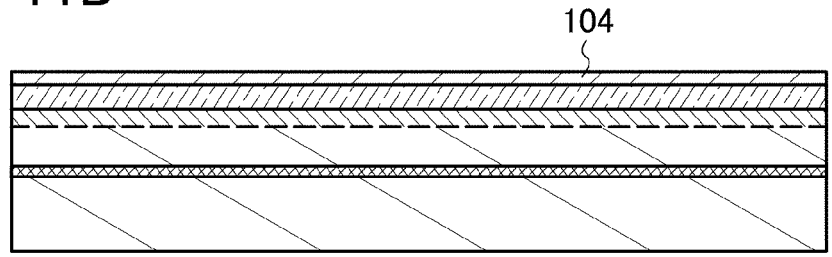

After that, the insulating layer 104 is formed over the first electrode 106 (see FIG. 11D). The manufacturing process following this step is the same as that of the foregoing embodiment.

Thus, in the example (3), since the first electrode 106 functions as a protective layer, a protective layer is not necessarily provided, which leads to shortening of the process.

The example (4) is described below with reference to FIGS. 12A to 12D.

Figure 12A:
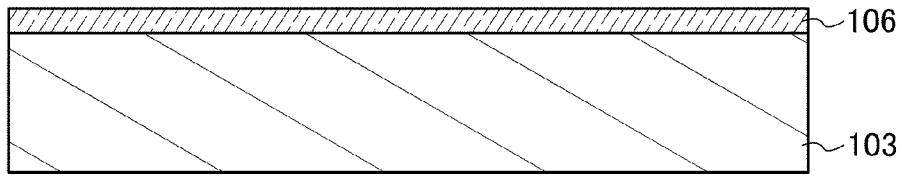
FIGS. 12A to 12D are cross-sectional views illustrating an example of a method for manufacturing a photoelectric conversion device.

The first electrode 106 is formed on one surface of the single crystal semiconductor substrate 103 (see FIG. 12A).

Figure 12B:
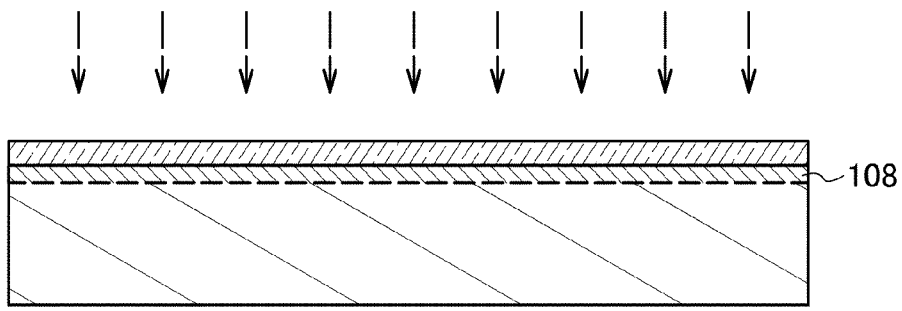

Next, the first impurity semiconductor layer 108 is formed by irradiating the single crystal semiconductor substrate 103 with an impurity element imparting one conductivity type through the surface of the first electrode 106 to add the impurity element imparting one conductivity type to the single crystal semiconductor substrate 103 (see FIG. 12B).

Figure 12C:
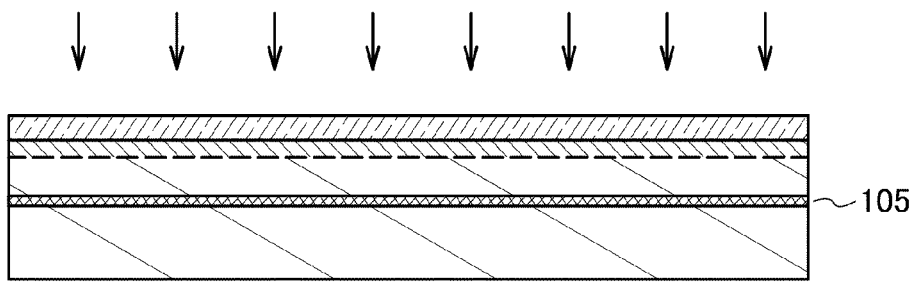

Then, the single crystal semiconductor substrate 103 is irradiated with ions through the surface of the first electrode 106 to form the embrittlement layer 105 in the single crystal semiconductor substrate 103 (see FIG. 12C).

Figure 12D:
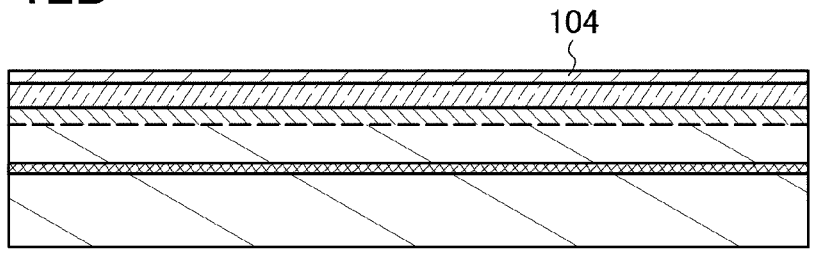

After that, the insulating layer 104 is formed over the first electrode 106 (see FIG. 12D). The manufacturing process following this step is the same as that of the foregoing embodiment.

Thus, in the example (4), since the first electrode 106 functions as a protective layer, a protective layer is not necessarily provided, which leads to shortening of the process.

Note that this embodiment can be combined with any of the other embodiments as appropriate.

Embodiment 3

This embodiment describes an example of a method for manufacturing a photoelectric conversion device, which is different from those of the foregoing embodiments.

Figure 22:
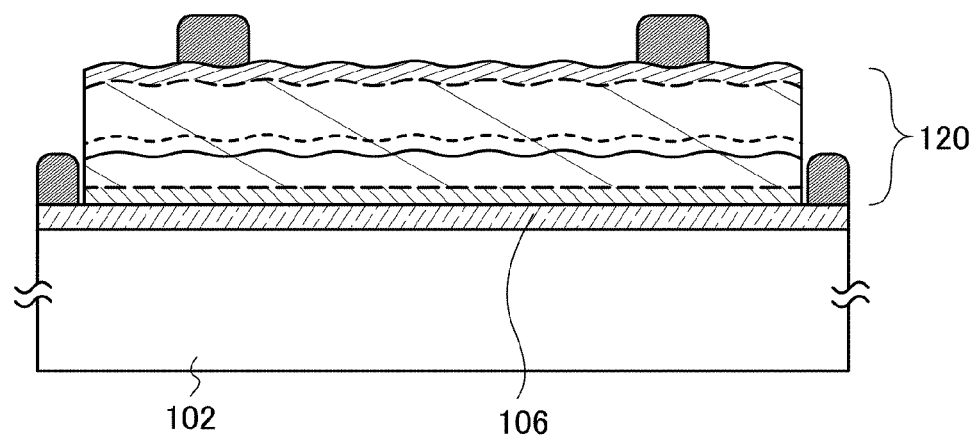
FIG. 22 is a cross-sectional view illustrating an example of a photoelectric conversion device.

FIG. 22 illustrates an example of a photoelectric conversion device which is formed by directly bonding the first electrode 106 and the supporting substrate 102 to each other. In the case where the first electrode 106 has a smooth surface, for example, in the case where the first electrode 106 has a surface with an average surface roughness ($R_a$) of 0.5 nm or less, preferably 0.3 nm or less, the first electrode 106 and the supporting substrate 102 can be bonded to each other without formation of the insulating layer 104 (see FIG. 1 and the like).

The bonding is performed by attaching the surface of the first electrode 106 and the surface of the supporting substrate 102 which are sufficiently cleaned to each other. It is needless to say that before the bonding, the surface of the first electrode 106 and/or the surface of the supporting substrate 102 may be activated. Further, after the bonding, heat treatment or pressure treatment may be performed. By forming the first electrode 106 having a smooth surface as in this embodiment, the insulating layer 104 is not necessarily provided, which leads to shortening of the process. Note that the foregoing description does not exclude formation of the insulating layer 104. For example, it can be said that it is preferable to form an insulating layer or the like which functions as a blocking layer also in the interest of improvement in reliability.

Note that this embodiment can be combined with any of the other embodiments as appropriate.

Embodiment 4

This embodiment describes an example of a method for manufacturing a photoelectric conversion device, which is different from those of the other embodiments.

In the foregoing embodiments, the surface of the first single crystal semiconductor layer 110 which is separated as a thin slice from the single crystal semiconductor substrate 103 has a crystal defect due to formation of the embrittlement layer 105 in some cases (see FIG. 4B). If there is such a crystal defect, photoelectric conversion efficiency might be decreased due to trapping of carriers or the like. Therefore, it is preferable to repair or remove the crystal defect. In specific, laser beam irradiation processing, etching treatment, or the like can be applied.

In the case where etching treatment is performed on the first single crystal semiconductor layer 110, the crystal defect can be removed. For such etching treatment, either dry etching or wet etching may be employed.

Figure 20:
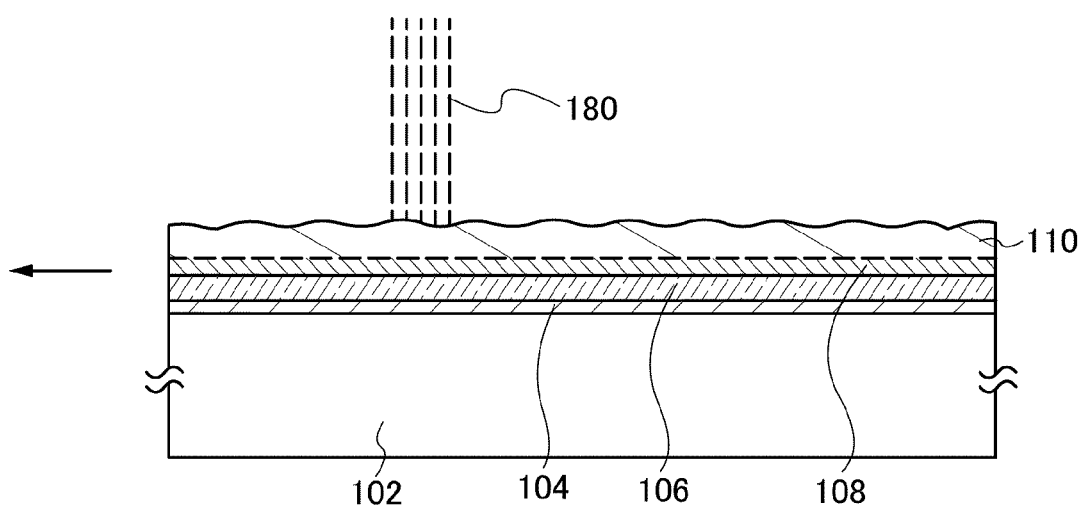
FIG. 20 is a cross-sectional view illustrating an example of a method for manufacturing a photoelectric conversion device.

FIG. 20 illustrates an example in which laser beam irradiation processing is performed. In the case where the first single crystal semiconductor layer 110 is irradiated with a laser beam with appropriate intensity, at least a region peripheral to the surface of the first single crystal semiconductor layer 110 is melted and a solid-phase region which is not melted serves as a seed crystal so that the first single crystal semiconductor layer 110 is recrystallized. The crystal defect of the first single crystal semiconductor layer 110 can be repaired through the process. Note that here, the supporting substrate 102 on which the first single crystal semiconductor layer 110 is provided is moved at the time of laser beam irradiation, whereby an entire surface of the first single crystal semiconductor layer 110 is irradiated with a laser beam; however, the disclosed embodiment of the invention is not limited thereto.

Although a laser beam 180 melts the region peripheral to the surface of the first single crystal semiconductor layer 110, the supporting substrate 102 is hardly heated; therefore, the laser beam 180 is preferably used in the case of using a supporting substrate with low heat resistance, such as a glass substrate. Here, it is preferable that the region to be irradiated with the laser beam 180 be heated at a temperature lower than or equal to the upper temperature limit of the supporting substrate (for example, from about 250° C. to about 600° C.) so that the defect can be effectively repaired. Note that by the foregoing laser beam irradiation processing or heat treatment, silicide is formed at an interface between the first impurity semiconductor layer 108 and the metal that forms the first electrode 106, whereby a current flows more easily. Further, by the foregoing laser beam irradiation processing or heat treatment, the first impurity semiconductor layer 108 can be activated.

The wavelength of the laser beam 180 is preferably in a range of from that of ultraviolet light to that of a visible light region but is not limited thereto. As a laser, the following can be used: an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, a gold vapor laser, or the like.

Note that laser beam irradiation is preferably performed in a reduced pressure atmosphere or an inert atmosphere. For performing laser beam irradiation in a reduced pressure atmosphere or an inert atmosphere, the laser beam irradiation may be performed controlling the atmosphere in an airtight chamber. In the case where the chamber is not used, by blowing an inert gas such as a nitrogen gas to the surface to be irradiated with the laser beam, the inert atmosphere can be formed.

Unevenness may be formed on the surface of the first single crystal semiconductor layer 110 by using a phase shift mask when laser beam irradiation processing is performed. For example, a phase shift mask can be used in which patterns with a length of 10 μm on each side are alternately arranged in a so-called checkered form. The laser beam enters through the phase shift mask, whereby the surface having unevenness depending on the pattern of the phase shift mask can be obtained. By forming such unevenness on the surface, the semiconductor layers to be formed later can be closely attached to the first single crystal semiconductor layer 110, so that peeling can be prevented. Further, since a light scattering effect and an antireflection effect due to unevenness of the surface can be obtained, photoelectric conversion efficiency can be increased.

Note that the laser beam irradiation processing and the etching treatment may be performed in combination.

Note that this embodiment can be combined with any of the other embodiments as appropriate.

Embodiment 5

This embodiment describes an example of a so-called tandem photoelectric conversion device in which a plurality of unit cells are stacked. Note that this embodiment describes a photoelectric conversion device in which two unit cells are stacked.

Figure 14:
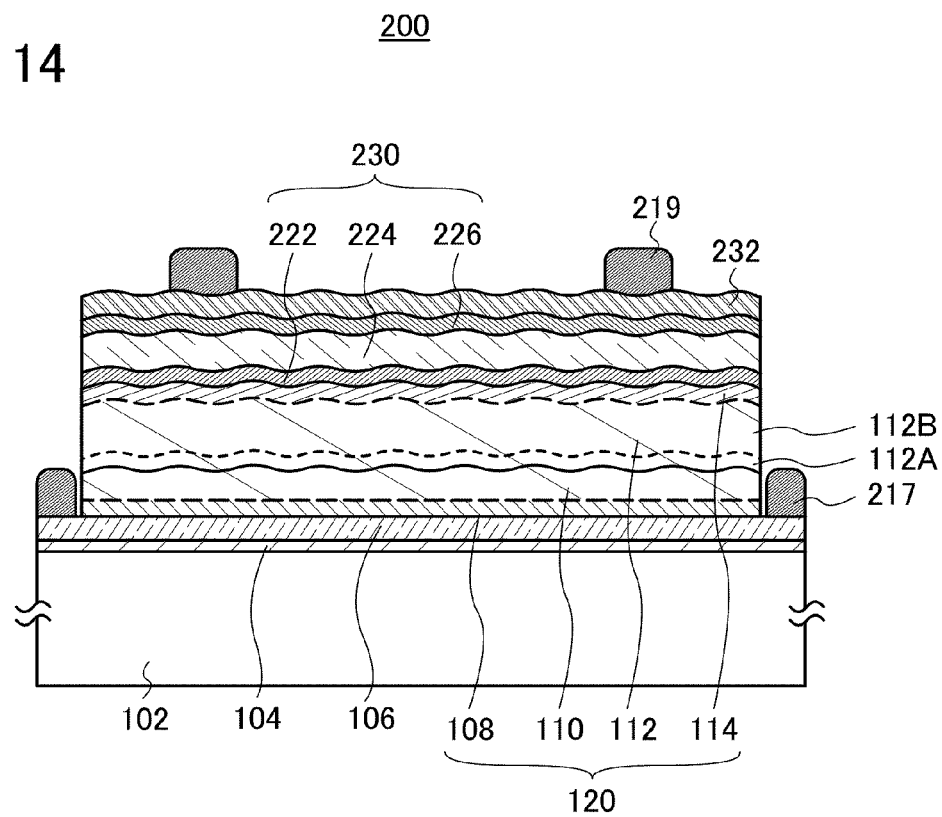
FIG. 14 is a cross-sectional view illustrating an example of a tandem photoelectric conversion device.

FIG. 14 illustrates a schematic cross-sectional view of a tandem photoelectric conversion device 200 according to this embodiment. The photoelectric conversion device 200 has a structure in which the unit cell 120 (which may also be called a first unit cell) and a unit cell 230 (which may also be called a second unit cell) are stacked on the supporting substrate 102. The first electrode 106 is provided between the supporting substrate 102 and the unit cell 120, and the insulating layer 104 is provided between the first electrode 106 and the supporting substrate 102. In this embodiment, since the structure and manufacturing method of the supporting substrate 102, the insulating layer 104, the first electrode 106 and thus the unit cell 120 are similar to those of Embodiment 1, the description thereof is not repeated.

The photoelectric conversion device 200 has a structure in which light enters from above (from the unit cell 230 side) in the drawing. Further, the band-gap energy of a semiconductor layer included in the unit cell 230 is larger than that of a semiconductor layer included in the unit cell 120. In specific, for example, a non-single-crystal semiconductor layer and a single crystal semiconductor layer can be used for the unit cell 230 and the unit cell 120, respectively. The photoelectric conversion layers having different band gaps are stacked, whereby a wavelength range of light that can be absorbed is widened and photoelectric conversion efficiency can be increased. In particular, since sunlight includes wide wavelength range of light from a short wavelength to a long wavelength, it is extremely effective to employ the structure described in this embodiment. Further, a photoelectric conversion layer with a large band gap is disposed on the light incident side, whereby light can be efficiently absorbed.

The unit cell 230 has a structure in which a third impurity semiconductor layer 222 having one conductivity type, a non-single-crystal semiconductor layer 224, and a fourth impurity semiconductor layer 226 having a conductivity type opposite to that of the third impurity semiconductor layer 222 are stacked in order over the unit cell 120. Here, the third impurity semiconductor layer 222 has a conductivity type opposite to that of the second impurity semiconductor layer 114 of the unit cell 120.

Amorphous silicon, microcrystalline silicon, or the like can be used for the non-single-crystal semiconductor layer 224 of the unit cell 230. The third impurity semiconductor layer 222 and the fourth impurity semiconductor layer 226 are each an amorphous semiconductor layer or a microcrystalline semiconductor layer which contains an impurity element having a predetermined conductivity type. Alternatively, amorphous silicon carbide may be used. In the case where the third impurity semiconductor layer 222 has p-type conductivity, the fourth impurity semiconductor layer 226 has n-type conductivity, and it is also possible that the third impurity semiconductor layer 222 have n-type conductivity and the fourth impurity semiconductor layer 226 have p-type conductivity.

The non-single-crystal semiconductor layer 224 can be formed by a plasma CVD method. For example, amorphous silicon may be formed using a silane based source gas. Note that the non-single-crystal semiconductor layer 224 may alternatively be formed by a sputtering method. In the case of using amorphous silicon for the non-single-crystal semiconductor layer 224, the thickness thereof is from 50 nm to 300 nm, preferably from 100 nm to 200 nm. Since the band gap of amorphous silicon is about 1.75 eV, with the thickness of the above range, light with a shorter wavelength than 600 nm can be sufficiently absorbed.

Note that a microcrystalline semiconductor (typically, microcrystalline silicon) may be used for the non-single-crystal semiconductor layer 224. In this case, it is preferable that a thin amorphous semiconductor layer with a thickness of about several nanometers be formed over the unit cell 120 before the microcrystalline semiconductor is formed. This can prevent the possibility that epitaxial growth proceeds from a single crystal semiconductor to form a single crystal semiconductor layer. Note that the third impurity semiconductor layer 222 may be formed of a single crystal semiconductor layer; therefore, the thin amorphous semiconductor layer with a thickness of about several nanometers may be formed over the second impurity semiconductor layer 114 or the third impurity semiconductor layer 222.

The first electrode 106 is provided on the supporting substrate 102 of the unit cell 120, and a second electrode 232 is provided on the surface of the unit cell 230. Further, an auxiliary electrode 217 in connection with the first electrode 106 and an auxiliary electrode 219 in connection with the second electrode 232 are provided. The auxiliary electrode 217 and the auxiliary electrode 219 each function as an extracting electrode (also referred to as a collecting electrode) which extracts electric energy converted in the photoelectric conversion layer.

In the case where the unit cell 230 is formed using a non-single-crystal semiconductor, the lifetime of carriers is likely to be short, which might lead to reduction in photoelectric conversion efficiency. To prevent the reduction in photoelectric conversion efficiency, the second electrode 232 is formed on an entire surface of the substrate in this embodiment. Here, the second electrode 232 is formed using a material having high transmittance of sunlight to allow enough sunlight to enter the unit cell 230 and the unit cell 120. Further, the auxiliary electrode 219 in contact with the second electrode 232 is formed in a grid shape (or a comb-like shape or a pectinate shape).

Next, an example of a method for manufacturing the photoelectric conversion device 200 according to this embodiment is described with reference to FIGS. 15A and 15B and FIGS. 16A and 16B. Note that since the manufacturing method up to the formation of the second impurity semiconductor layer 114 is similar to that of Embodiment 1, the description thereof is omitted.

Figure 15A:
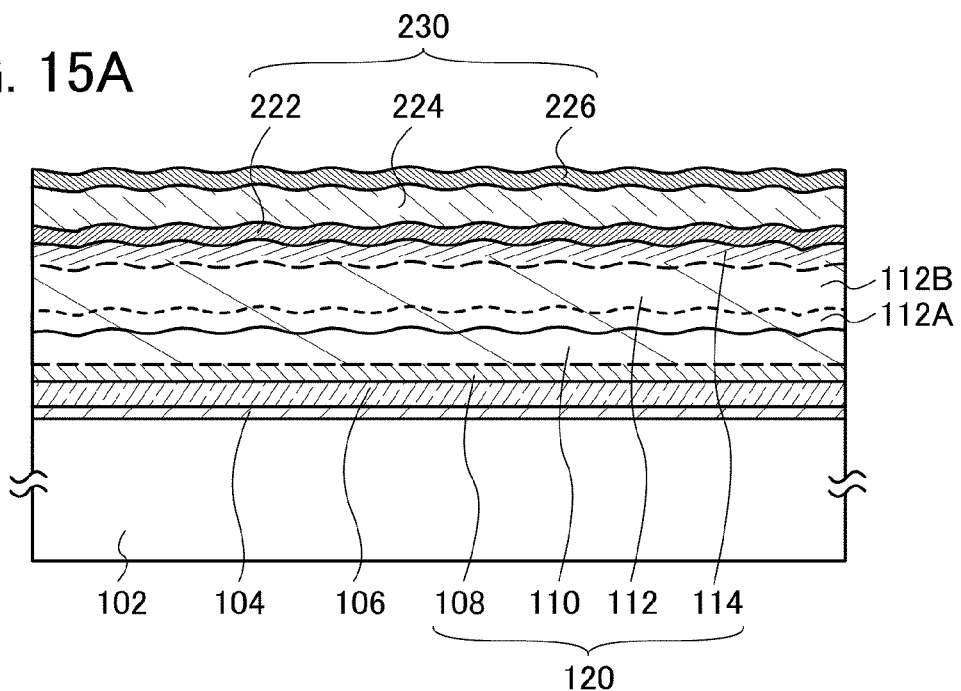
FIGS. 15A and 15B are cross-sectional views illustrating an example of a method for manufacturing a tandem photoelectric conversion device.

After the formation of the second impurity semiconductor layer 114, the third impurity semiconductor layer 222, the non-single-crystal semiconductor layer 224, and the fourth impurity semiconductor layer 226 are formed in order over the second impurity semiconductor layer 114 (see FIG. 15A).

Here, the third impurity semiconductor layer 222 is an amorphous or microcrystalline semiconductor layer having a conductivity type opposite to that of the second impurity semiconductor layer 114. For example, in the case where the second impurity semiconductor layer 114 has n-type conductivity, the third impurity semiconductor layer 222 is a p-type amorphous semiconductor layer (for example, a p-type amorphous silicon layer) or a p-type microcrystalline semiconductor layer (for example, a p-type microcrystalline silicon layer). The thickness of the third impurity semiconductor layer 222 may be from about 10 nm to about 100 nm.

Further, the non-single crystal semiconductor layer 224 is preferably an intrinsic semiconductor layer (for example, an i-type amorphous silicon layer or an i-type non-single crystal silicon layer) that does not include an impurity element imparting a conductivity type. The thickness of the non-single-crystal semiconductor layer 224 is from 50 nm to 300 nm, preferably from 100 nm to 200 nm.

Further, the fourth impurity semiconductor layer 226 is an amorphous or microcrystalline semiconductor layer having a conductivity type opposite to that of the third impurity semiconductor layer 222. For example, in the case where the third impurity semiconductor layer 222 has p-type conductivity, the fourth impurity semiconductor layer 226 is an n-type amorphous semiconductor layer (for example, an n-type amorphous silicon layer) or an n-type microcrystalline semiconductor layer (for example, an n-type microcrystalline silicon layer). The thickness of the fourth impurity semiconductor layer 226 may be about 10 to 100 nm.

The third impurity semiconductor layer 222, the non-single-crystal semiconductor layer 224, and the fourth impurity semiconductor layer 226 are formed by a CVD method or a sputtering method. Note that in the case where a non-single-crystal silicon layer is formed by a vapor phase growth method such as a plasma CVD method, diborane or the like is added to a source gas so that the non-single-crystal silicon layer has p-type conductivity. Meanwhile, in the case where the non-single-crystal silicon layer has n-type conductivity, phosphine or the like may be added to a source gas.

As described above, the unit cell 230 can be obtained in which the third impurity semiconductor layer 222 having one conductivity type, the non-single-crystal semiconductor layer 224, and the fourth impurity semiconductor layer 226 having a conductivity type opposite to that of the third impurity semiconductor layer 222 are stacked in order.

Figure 15B:
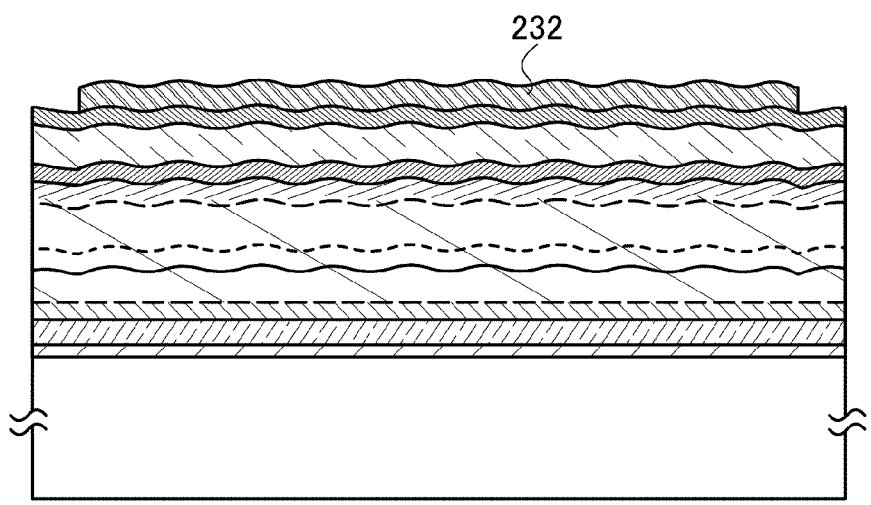

Next, the second electrode 232 is formed over the fourth impurity semiconductor layer 226 (see FIG. 15B). The second electrode 232 can be formed using a sputtering method or a vacuum deposition method. Further, the second electrode 232 is preferably formed using a material that transmits sunlight sufficiently. As the material, metal oxide such as an indium tin oxide (ITO) alloy, an alloy of indium oxide and zinc oxide, zinc oxide, tin oxide, or the like may be used. The second electrode 232 may be formed to have a thickness of about 40 to 200 nm (preferably, about 50 nm to 100 nm) and a sheet resistance of about 20 to 200 Ω/square.

In this embodiment, the second electrode 232 is selectively formed over the unit cell 230. For example, the second electrode 232 is formed using a shadow mask. The second electrode 232 formed selectively can be used as a mask for etching to expose a part (preferably an end portion) of the first electrode 106.

Note that the second electrode 232 may be formed using a conductive macromolecular material (also referred to as a conductive polymer). As the conductive macromolecular material, a π electron conjugated macromolecule can be used. For example, polyaniline and/or a derivative thereof, polypyrrole and/or a derivative thereof, polythiophene and/or a derivative thereof, and a copolymer of two or more kinds of those materials, or the like may be used.

Figure 16A:
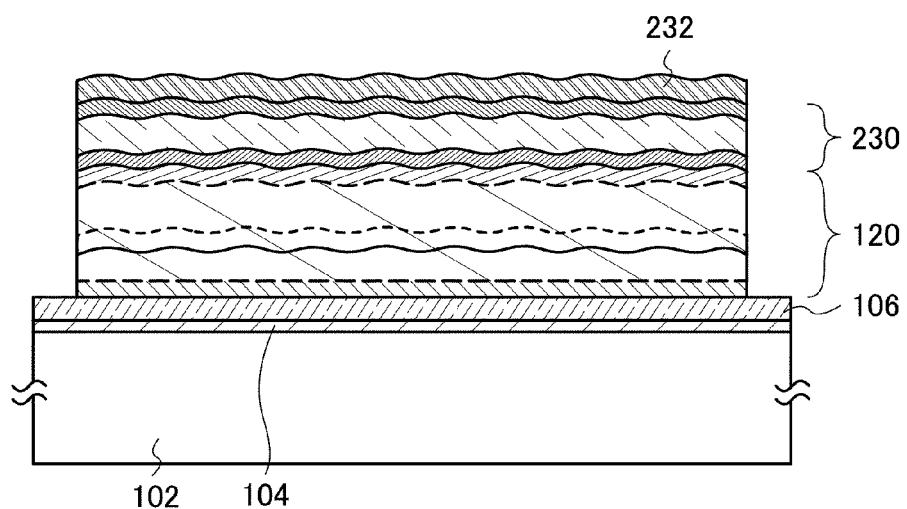
FIGS. 16A and 16B are cross-sectional views illustrating an example of a method for manufacturing a tandem photoelectric conversion device.

Next, the fourth impurity semiconductor layer 226, the non-single-crystal semiconductor layer 224, the third impurity semiconductor layer 222, the second impurity semiconductor layer 114, the second single crystal semiconductor layer 112, the first single crystal semiconductor layer 110, and the first impurity semiconductor layer 108 are etched using the second electrode 232 as a mask to expose the part of the first electrode 106 (see FIG. 16A).

The etching may be performed by dry etching using a fluorine based gas such as $NF_3$ or $SF_6$ under the condition where the etching selectivity of the layers formed over the first electrode 106 (layers included in the unit cell 120 and the unit cell 230) to the first electrode 106 is sufficiently high. Since the second electrode 232 can be used as a mask here, an extra mask for the etching is not required. It is needless to say that a mask for the etching may be formed using a resist or an insulating layer.

Figure 16B:
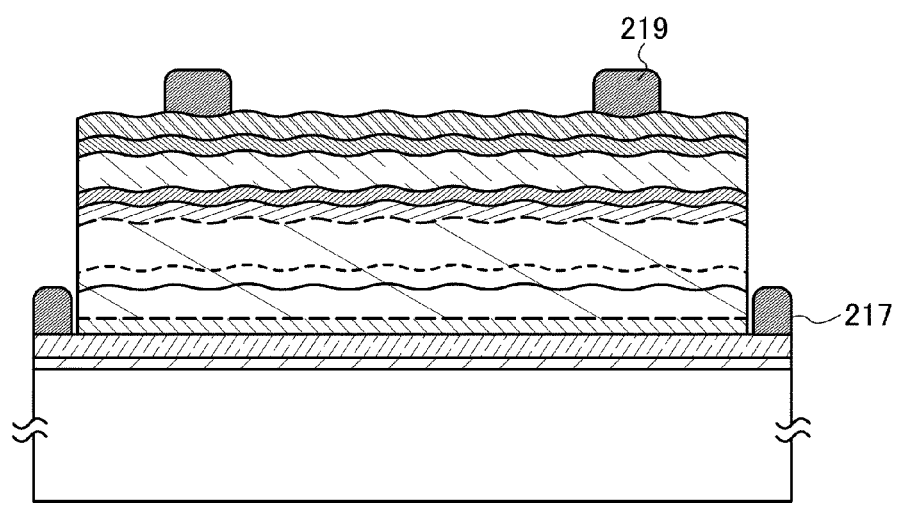

After that, the auxiliary electrode 217 which is connected to the first electrode 106 and the auxiliary electrode 219 which is connected to the second electrode 232 are formed (see FIG. 16B).

The auxiliary electrode 219 is formed so as to have a grid shape (or a comb-like shape or a pectinate shape) as seen from above, as illustrated in FIG. 2. Accordingly, enough light can enter the unit cell 230 and the unit cell 120, so that light absorption efficiency can be increased. Further, the auxiliary electrode 217 is formed in contact with the first electrode 106 which has been exposed by the former etching.

The auxiliary electrode 217 and the auxiliary electrode 219 may be formed using aluminum, silver, lead-tin (solder), or the like by a printing method or the like. For example, the auxiliary electrode 217 and the auxiliary electrode 219 can be formed using a silver paste by a screen printing method.

As described above, the photoelectric conversion device 200 which is a so-called tandem type can be formed.

Although not illustrated in this embodiment, a passivation layer 119 which has an antireflection function is preferably formed for the tandem photoelectric conversion device 200.

Figure 17A:
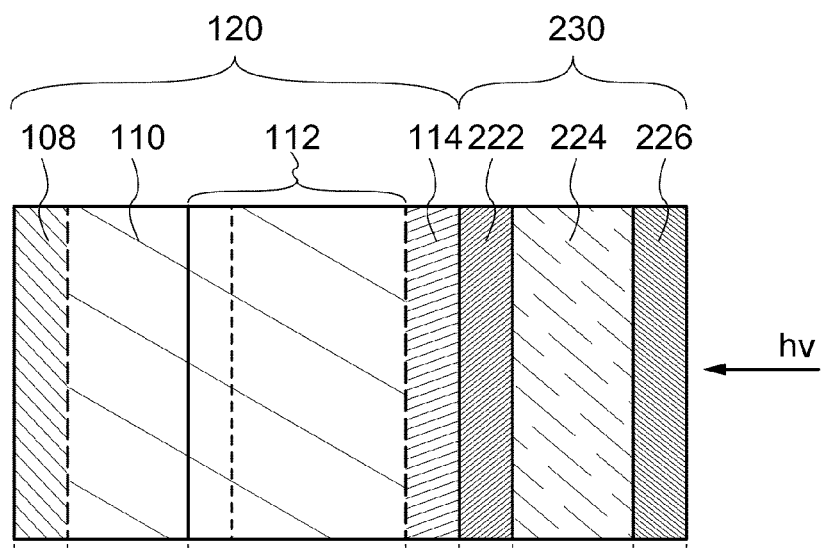
FIG. 17A is a cross-sectional view illustrating a unit cell of a tandem photoelectric conversion device and FIG. 17B is an energy band diagram corresponding to the unit cell of the tandem photoelectric conversion device.

FIG. 17A illustrates a cross-sectional schematic view illustrating an example of the unit cell 120 and the unit cell 230 which are included in the photoelectric conversion device. Here, the unit cell 120 has a structure in which the first impurity semiconductor layer 108 to which a p-type impurity element is added at high concentration (p+ layer), the p-type first single crystal semiconductor layer 110 (p layer), the i-type second single crystal semiconductor layer 112 (i layer), and the second impurity semiconductor layer 114 to which an n-type impurity element is added (n+ layer or n layer) are stacked in order, and the unit cell 230 has a structure in which the p-type third impurity semiconductor layer 222 (p+ layer or p layer), the i-type non-single-crystal semiconductor layer 224 (i layer), and the n-type fourth impurity semiconductor layer 226 (n+ layer or n layer) are stacked in order; however, the disclosed embodiment of the invention is not limited thereto. Note that in the case where the single crystal semiconductor layer in the unit cell 120 is single crystal silicon, the band-gap energy of the single crystal silicon is about 1.12 eV; and in the case where the non-single-crystal semiconductor layer in the unit cell 230 is amorphous silicon, the band-gap energy of the amorphous silicon is about 1.75 eV. Note that light (energy: hν) enters from the fourth impurity semiconductor layer 226 side.

Figure 17B:
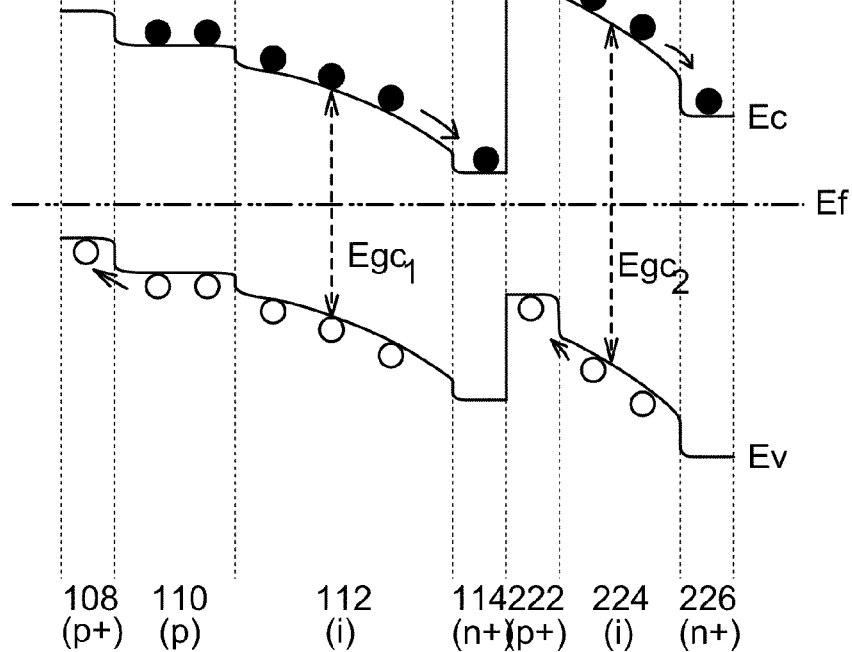

FIG. 17B illustrates an energy band diagram of the unit cell 120 and the unit cell 230 which are illustrated in FIG. 17A. Here, $E_c$ indicates a bottom of a conduction band, $E_v$ indicates a top of a valence band, and $E_f$ indicates Fermi level. Further, $E_{gc1}$ indicates the band-gap energy of the unit cell 120 (about 1.12 eV) and $E_{gc2}$ indicates the band-gap energy of the unit cell 230 (about 1.75 eV).

According to the band structure shown in FIG. 17B, electrons generated in each unit cell by optical excitation flow in the direction of the n+ layer (or the n layer) of the unit cell, whereas holes generated in the unit cell by optical excitation flow in the direction of the p+ layer (or the p layer). This is a basic principle of photoelectric conversion. Since a recombination current flows at the connecting portion of the unit cell 120 and the unit cell 230, the current can be extracted.

By using the unit cell 120 including the single crystal semiconductor layer as a bottom cell, light with a wavelength of 800 nm or more can be absorbed to be converted into electric energy. Further, by using the unit cell 230 including the non-single-crystal semiconductor layer as a top cell, light with a wavelength of less than 800 nm, which is not absorbed by a single crystal semiconductor layer, can be absorbed to be converted into electric energy. Such a structure in which unit cells having different band gaps are stacked (so-called tandem structure) makes it possible to significantly increase photoelectric conversion efficiency.

Note that this embodiment can be combined with any of the other embodiments as appropriate.

Embodiment 6

In this embodiment, an example of a photoelectric conversion device in which a plurality of unit cells are stacked, specifically, a so-called stacked photoelectric conversion device 300 in which three unit cells are stacked is described.

Figure 18:
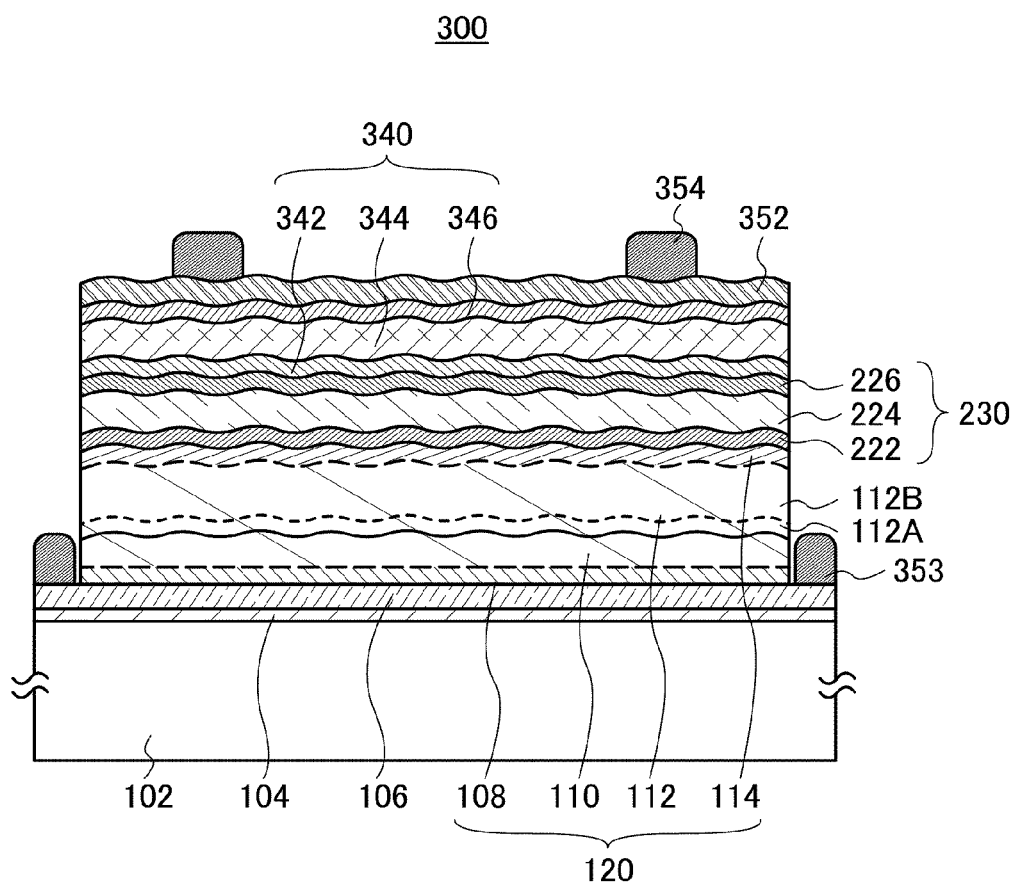
FIG. 18 is a cross-sectional view illustrating an example of a stacked photoelectric conversion device.

FIG. 18 illustrates a schematic cross-sectional view of the stacked photoelectric conversion device 300 according to this embodiment. The photoelectric conversion device 300 has a structure in which the unit cell 120 (which may also be called a first unit cell), the unit cell 230 (which may also be called a second unit cell), and a unit cell 340 (which may also be called a third unit cell) are stacked on the supporting substrate 102. The first electrode 106 is provided between the supporting substrate 102 and the unit cell 120, and the insulating layer 104 is provided between the first electrode 106 and the supporting substrate 102. In this embodiment, the structure and manufacturing method of the supporting substrate 102, the insulating layer 104, the first electrode 106, and the unit cell 120 are similar to those of Embodiment 1 and thus the description thereof is not repeated. In addition, the structure and manufacturing method of the unit cell 230 are similar to those of Embodiment 5 and thus the description thereof is not repeated.

The photoelectric conversion device 300 has a structure in which light enters from above (from the unit cell 340 side) in the drawing. Further, the band-gap energies of semiconductor layers included in the unit cell 340, the unit cell 230, and the unit cell 120 decrease from the light incident side. That is, band gap energy is large in order of the unit cell 340, the unit cell 230, and the unit cell 120 Thus, band-gap energies of the unit cells are different and the unit cells are arranged in descending order of band-gap energy from the light incident side, whereby light can be efficiently absorbed.

For example, in the case where single crystal silicon is used for the semiconductor layer included in the unit cell 120, the band-gap energy of single crystal silicon is about 1.12 eV; therefore, materials having a larger band-gap energy than single crystal silicon are used for the semiconductor layers included in the unit cell 230 and the unit cell 340. In specific, for example, a material having a band-gap energy of 1.45 to 1.65 eV (amorphous silicon germanium or the like) may be used for the semiconductor layer in the unit cell 230, and a material having a band-gap energy of 1.7 to 2.0 eV (amorphous silicon, amorphous silicon carbide, or the like) may be used for the semiconductor layer in the unit cell 340.

The unit cell 340 has a structure in which a fifth impurity semiconductor layer 342 having one conductivity type, a non-single-crystal semiconductor layer 344, and a sixth impurity semiconductor layer 346 having a conductivity type opposite to that of the fifth impurity semiconductor layer 342 are stacked in order over the unit cell 230. Here, the fifth impurity semiconductor layer 342 has a conductivity type opposite to that of the fourth impurity semiconductor layer 226 of the unit cell 230.

The first electrode 106 is provided on the supporting substrate 102 of the unit cell 120, and a second electrode 352 is provided on the surface of the unit cell 340. Further, an auxiliary electrode 353 in connection with the first electrode 106 and an auxiliary electrode 354 in connection with the second electrode 352 are provided. The auxiliary electrode 353 and the auxiliary electrode 354 each function as an extracting electrode (also referred to as a collecting electrode) which extracts electric energy converted in the photoelectric conversion layer.

Figure 19A:
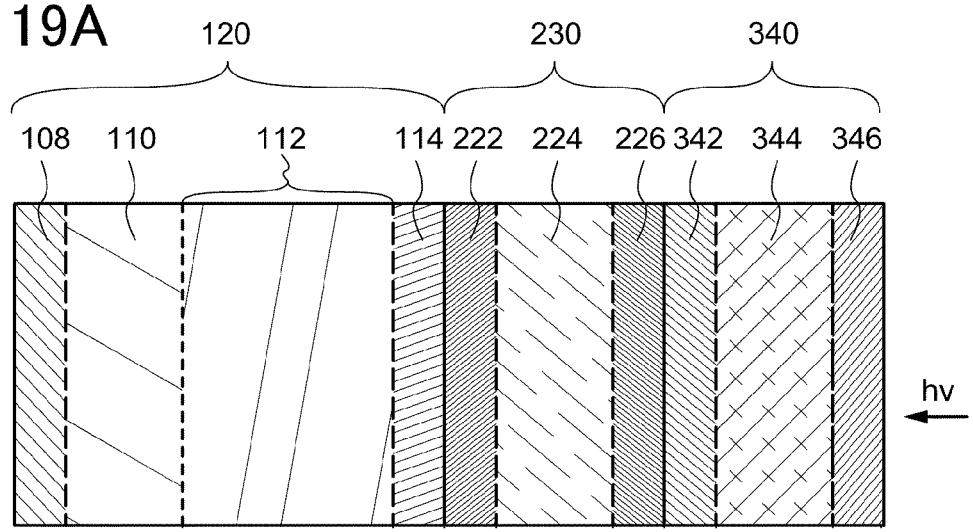
FIG. 19A is a cross-sectional view illustrating a unit cell of a stacked photoelectric conversion device and FIG. 19B is an energy band diagram corresponding to the unit cell of the stacked photoelectric conversion device.

FIG. 19A illustrates a cross-sectional schematic view illustrating an example of the unit cell 120, the unit cell 230, and the unit cell 340 which are included in the photoelectric conversion device. Here, the unit cell 120 has a structure in which the first impurity semiconductor layer 108 to which a p-type impurity element is added at high concentration (p+ layer), the p-type first single crystal semiconductor layer 110 (p layer), the i-type second single crystal semiconductor layer 112 (i layer), and the second impurity semiconductor layer 114 to which an n-type impurity element is added (n+ layer or n layer) are stacked in order, the unit cell 230 has a structure in which the p-type third impurity semiconductor layer 222 (p+ layer or p layer), the i-type non-single-crystal semiconductor layer 224 (i layer), and the n-type fourth impurity semiconductor layer 226 (n+ layer or n layer) are stacked in order, and the unit cell 340 has a structure in which the p-type fifth impurity semiconductor layer 342 (p+ layer or p layer), the i-type non-single-crystal semiconductor layer 344 (i layer), and the n-type sixth impurity semiconductor layer 346 (n+ layer or n layer) are stacked in order; however, the disclosed embodiment of the invention is not limited thereto.

Figure 19B:
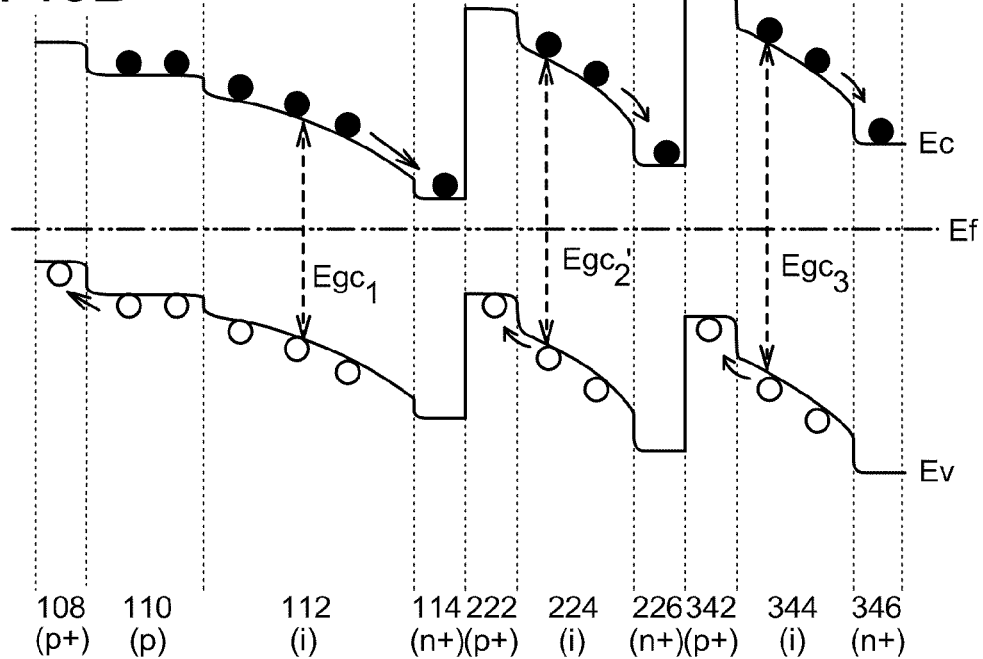

FIG. 19B illustrates an energy band diagram of the unit cell 120, the unit cell 230, and the unit cell 340 which are illustrated in FIG. 19A. Here, $E_c$ indicates a bottom of a conduction band, $E_v$ indicates a top of a valence band, and $E_f$ indicates Fermi level. Further, $E_{gc1}$ indicates the band-gap energy of the unit cell 120, $E_{gc2}$ indicates the band-gap energy of the unit cell 230, and $E_{gc3}$ indicates the band-gap energy of the unit cell 340.

According to the band structure shown in FIG. 19B, electrons generated in each unit cell by optical excitation flow in the direction of the n+ layer (or the n layer) of the unit cell, whereas holes generated in the unit cell by optical excitation flow in the direction of the p+ layer (or the p layer). This shows a basic principle of photoelectric conversion. Since a recombination current flows at the connecting portion of the unit cell 120 and the unit cell 230, and the connecting portion of the unit cell 230 and the unit cell 340, the current can be extracted.

As described above, by employing the so-called stacked structure, the wavelength range of light that is absorbed can be widened, which makes it possible to increase photoelectric conversion efficiency.

Note that this embodiment can be combined with any of the other embodiments as appropriate.

Embodiment 7

Figure 23A:
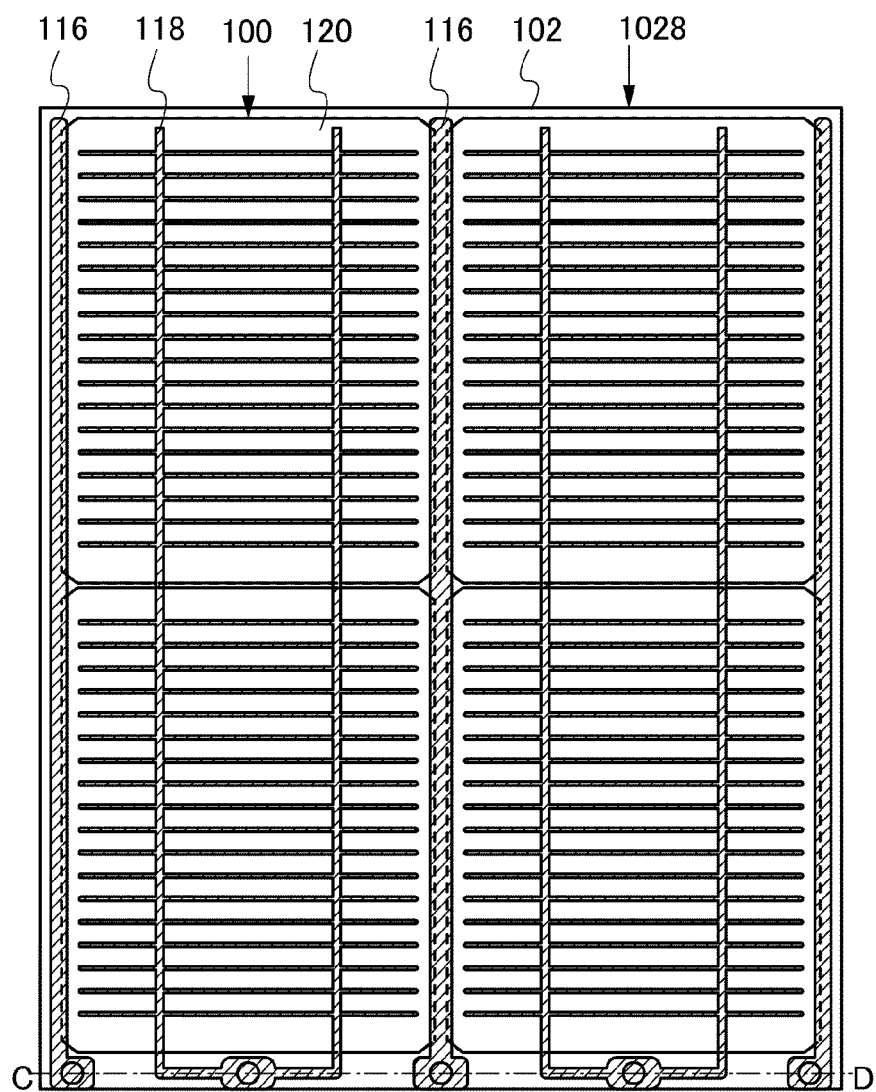
FIGS. 23A and 23B are schematic diagrams for illustrating a structure of a photovoltaic power generation module.

A photovoltaic power generation module can be manufactured using the photoelectric conversion device obtained by any of Embodiments 1 to 6 and the like. In this embodiment, an example of a photovoltaic power generation module using the photoelectric conversion device described in Embodiment 1 is illustrated in FIG. 23A. A photovoltaic power generation module 1028 includes the unit cell 120 provided on the supporting substrate 102. Between the supporting substrate 102 and the unit cell 120, the insulating layer 104 and the first electrode 106 are provided in order from the supporting substrate 102 side. Further, the first electrode 106 is connected to the auxiliary electrode 116.

Figure 23B:
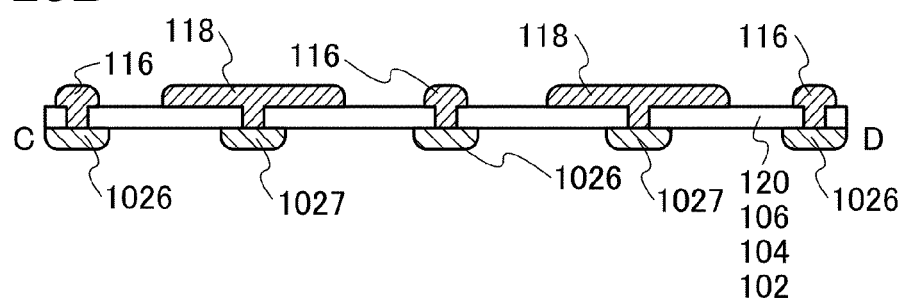

The auxiliary electrode 116 and the second electrode 118 are formed on one surface of the supporting substrate 102 (the side where the unit cell 120 is formed) and are connected to a back electrode 1026 and a back electrode 1027 which are used for an external terminal connector, respectively at end portions of the supporting substrate 102. FIG. 23B illustrates a cross-sectional view along C-D in FIG. 23A. The auxiliary electrode 116 and the second electrode 118 are connected to the back electrode 1026 and the back electrode 1027 respectively, through penetration openings of the supporting substrate 102.

Note that this embodiment can be combined with any of the other embodiments as appropriate.

Embodiment 8

Figure 24:
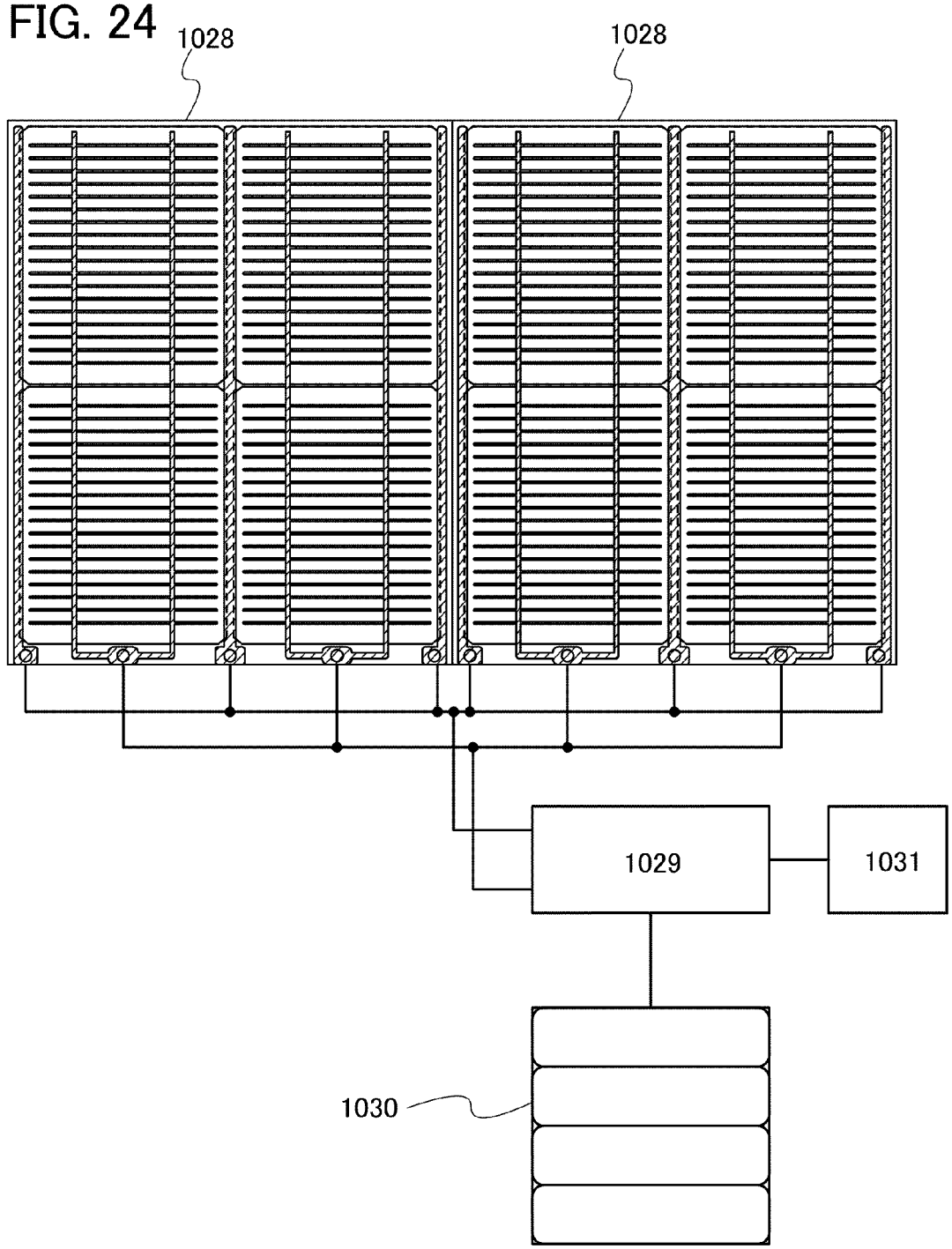
FIG. 24 is a schematic diagram for illustrating an example of a photovoltaic power generation system.

FIG. 24 illustrates an example of a photovoltaic power generation system using the photovoltaic power generation module 1028 described in Embodiment 7. A storage battery 1030 is charged using power of a charge control circuit 1029, which is supplied from one or a plurality of photovoltaic power generation modules 1028. Further, when the storage battery 1030 is sufficiently charged, the power supplied from the photovoltaic power generation modules 1028 is output directly to a load 1031.

When an electric double layer capacitor is used as the storage battery 1030, the storage battery 1030 can be charged rapidly without chemical reaction in charging. Further, lifetime can be increased by about 8 times and charging and discharging efficiency can be increased by about 1.5 times compared with those of a lead storage battery or the like which uses chemical reaction. The photovoltaic power generation system described in this embodiment can be used in the load 1031 which uses power, such as lighting or an electronic appliance.

Note that this embodiment can be combined with any of the other embodiments as appropriate.

EXAMPLE 1

In this example, characteristics of a single crystal silicon layer provided on a glass substrate according to any of the disclosed embodiments of the invention are described with reference to FIG. 25.

First, a single crystal silicon layer was provided on a glass substrate according to any of methods described in the foregoing embodiments. In this example, a stack including a 50 nm-thick silicon oxide layer, a 50-nm thick silicon nitride oxide layer, and a 120 nm-thick single crystal silicon layer was provided on a 0.7 mm-thick glass substrate. Then, a silicon layer with high crystallinity and a silicon layer with low crystallinity were formed in order over the single crystal silicon layer.

The silicon layer with high crystallinity were formed under the following conditions: the deposition method was plasma CVD; the source gas was 4 sccm of silane and 400 sccm of hydrogen; the power (frequency) was 15 W (60 MHz); the pressure was 100 Pa; the distance between electrodes was 20 mm; the glass substrate temperature was 280° C.; and the thickness was 20 nm.

Further, the silicon layer with low crystallinity were formed under the following conditions: the deposition method was plasma CVD; the source gas was 25 sccm of silane and 150 sccm of hydrogen; the power (frequency) was 30 W (27 MHz); the pressure was 66.6 Pa; the distance between electrodes was 25 mm; the glass substrate temperature was 280° C.; and the thickness was 480 nm.

Characteristics of the silicon layer with low crystallinity were observed as the silicon layer with low crystallinity is formed. In specific, surface observation of the silicon layer with a microscope, Raman spectroscopic observation, and Electron BackScattering Pattern (EBSP) observation were conducted.

After that, single-crystallization of the semiconductor layer with low crystallinity was performed by solid phase epitaxial growth. In specific, heat treatment was performed at 650° C. for six minutes with a gas rapid thermal annealing (GRTA) apparatus employing a gas heating method. Note that since the silicon layer with high crystallinity formed in this embodiment was a single crystal silicon layer, the crystallinity was not so significantly changed by the heat treatment. It is needless to say that in the case where the silicon layer with high crystallinity was not a single crystal silicon layer, single-crystallization was performed by solid phase growth. Further, in this stage, peeling of the silicon layer was not caused. After the heat treatment, surface observation, Raman spectroscopic observation, and EBSP observation were conducted again.

Figure 25:
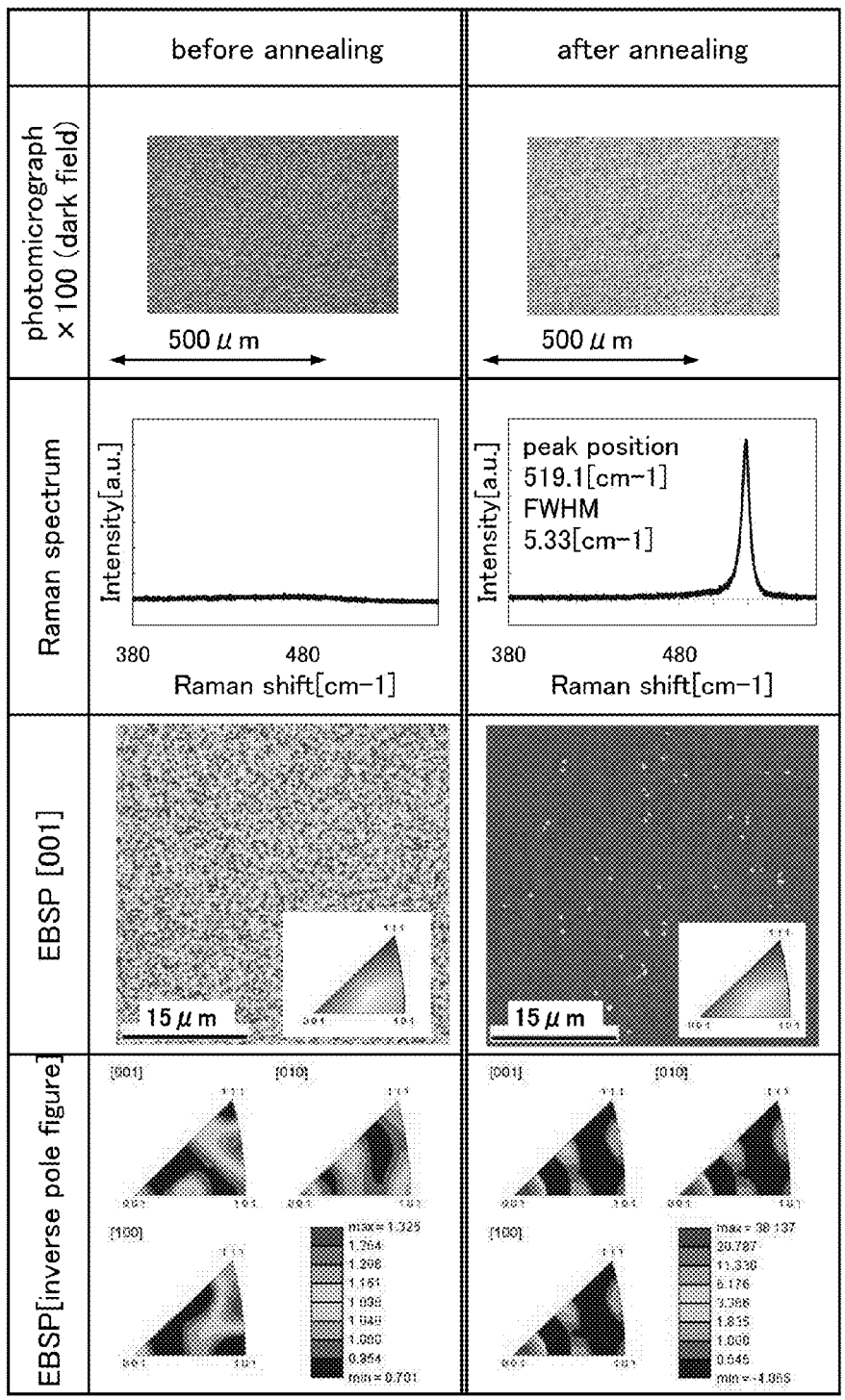
FIG. 25 shows observation results in Example 1.

FIG. 25 shows all the observation results. The observation result before heat treatment is shown in a left column and the observation result after heat treatment is shown in a right column. According to comparison between them, characteristics of the semiconductor layer are significantly changed after the heat treatment. For example, a peak wavenumber in the Raman spectrum after the heat treatment is 519.1 cm$^{-1}$ and the peak is sharp (a full width at half maximum of 5.33 cm$^{-1}$). Further, EBSP observation results show that crystals are regularly arranged and thus single-crystallization is substantially performed.

By using such a semiconductor layer, a photoelectric conversion device with excellent characteristics can be manufactured.

REFERENCE EXAMPLE

For comparison, a silicon layer with low crystallinity was directly formed on a single crystal silicon layer and then heat treatment for solid phase growth was performed. Note that although a silicon layer with low crystallinity (with a thickness of 500 nm) was used instead of a stack of a silicon layer with high crystallinity and a silicon layer with low crystallinity in this example, the other conditions were the same as those of the foregoing example.

As a result of the heat treatment, peeling of the semiconductor layer was caused in this example. It is understood that this is because the single crystal silicon layer and the silicon layer with low crystallinity do not have strong contact with each other. In this example, effectiveness of the disclosed embodiments of the invention can be confirmed.

This application is based on Japanese Patent Application serial no. 2008-114744 filed with Japan Patent Office on Apr. 25, 2008, the entire contents of which are hereby incorporated by reference.

What is claimed is:

1. A method for manufacturing a photoelectric conversion device, comprising:
   forming a first impurity semiconductor layer over a single crystal semicondcutor substrate;
   irradiating the single crystal semiconductor substrate with ions to form an embrittlement layer in the single crystal semiconductor substrate;
   forming a first electrode over the first impurity semiconductor layer;
   forming an insulating layer over the first electrode;
   attaching the insulating layer and a supporting substrate to each other to bond the single crystal semiconductor substrate and the supporting substrate and then separating the single crystal semiconductor substrate along the embrittlement layer, whereby a stack including the insulating layer, the first electrode, the first impurity semiconductor layer, and a first single crystal semiconductor layer is provided on the supporting substrate;
   forming a first semiconductor layer over the first single crystal semiconductor layer;
   forming a second semiconductor layer over the first semiconductor layer under a condition different from that of the first semiconductor layer;
   forming a second single crystal semiconductor layer by improving crystallinity of the first semiconductor layer and the second semiconductor layer by solid phase growth;
   forming a second impurity semiconductor layer having a conductivity type opposite to that of the first impurity semiconductor layer over the second single crystal semiconductor layer; and
   forming a second electrode over the second impurity semiconductor layer.

2. The method for manufacturing a photoelectric conversion device, according to claim 1,
   wherein the first semiconductor layer and the second semiconductor layer are formed such that crystallinity of the first semiconductor layer is higher than that of the second semiconductor layer.

3. The method for manufacturing a photoelectric conversion device, according to claim 1,
   wherein the first semiconductor layer and the second semiconductor layer are formed such that hydrogen concentration of the first semiconductor layer is lower than that of the second semiconductor layer.

4. The method for manufacturing a photoelectric conversion device, according to claim 1,
   wherein the first semiconductor layer is formed to a thickness of from 10 nm to 50 nm.

5. The method for manufacturing a photoelectric conversion device, according to claim 1,
   wherein ions generated with a source gas containing hydrogen are used as the ions.

6. The method for manufacturing a photoelectric conversion device, according to claim 1,
   wherein the first single crystal semiconductor layer and the second single crystal semiconductor layer are formed such that the total thickness of the first single crystal semiconductor layer and the second single crystal semiconductor layer is 800 nm or more.

7. The method for manufacturing a photoelectric conversion device, according to claim 1,
   wherein the first impurity semiconductor layer is a p-type impurity semiconductor layer, and
   wherein the second impurity semiconductor layer is an n-type impurity semiconductor layer.

8. The method for manufacturing a photoelectric conversion device, according to claim 1,
   wherein the first semiconductor layer is formed by a plasma chemical vapor deposition method in which a flow ratio of a hydrogen gas to a silane based gas is 50:1 or more.

9. The method for manufacturing a photoelectric conversion device, according to claim 8,
   wherein the silane based gas is silane or disilane.

10. The method for manufacturing a photoelectric conversion device, according to claim 8 or 9,
    wherein the plasma chemical vapor deposition method is performed under a pressure of from 1 Pa to $10^3$ Pa.

11. The method for manufacturing a photoelectric conversion device, according to claim 1,
    wherein the first impurity semicondcutor layer and the second impurity semiconductor layer are formed by an ion implantation method or an ion doping method.

12. The method for manufacturing a photoelectric conversion device, according to claim 1,
    wherein the first single crystal semiconductor layer is irradiated with a laser beam to repair or remove a crystal defect included in the first single crystal semicondcutor layer.

13. The method for manufacturing a photoelectric conversion device, according to claim 1, wherein the second single crystal semicondcutor layer is formed by heating the first semiconductor layer and the second semiconductor layer by rapid thermal annealing.

14. A method for manufacturing a photoelectric conversion device, comprising:
    irradiating a single crystal semiconductor substrate with ions to form an embrittlement layer in the single crystal semiconductor substrate;
    forming a first impurity semiconductor layer over the single crystal semicondcutor substrate;
    forming a first electrode over the first impurity semiconductor layer;
    forming an insulating layer over the first electrode;
    attaching the insulating layer and a supporting substrate to each other to bond the single crystal semiconductor substrate and the supporting substrate and then separating the single crystal semiconductor substrate along the embrittlement layer, whereby a stack including the insulating layer, the first electrode, the first impurity semiconductor layer, and a first single crystal semiconductor layer is provided on the supporting substrate;
    forming a first semiconductor layer over the first single crystal semiconductor layer;
    forming a second semiconductor layer over the first semiconductor layer under a condition different from that of the first semiconductor layer;
    forming a second single crystal semiconductor layer by improving crystallinity of the first semiconductor layer and the second semiconductor layer by solid phase growth;

forming a second impurity semiconductor layer having a conductivity type opposite to that of the first impurity semiconductor layer over the second single crystal semiconductor layer; and forming a second electrode over the second impurity semiconductor layer.

15. The method for manufacturing a photoelectric conversion device, according to claim 14, wherein the first semiconductor layer and the second semiconductor layer are formed such that crystallinity of the first semiconductor layer is higher than that of the second semiconductor layer.

16. The method for manufacturing a photoelectric conversion device, according to claim 14, wherein the first semiconductor layer and the second semiconductor layer are formed such that hydrogen concentration of the first semiconductor layer is lower than that of the second semiconductor layer.

17. The method for manufacturing a photoelectric conversion device, according to claim 14, wherein the first semiconductor layer is formed to a thickness of from 10 nm to 50 nm.

18. The method for manufacturing a photoelectric conversion device, according to claim 14, wherein ions generated with a source gas containing hydrogen are used as the ions.

19. The method for manufacturing a photoelectric conversion device, according to claim 14, wherein the first single crystal semiconductor layer and the second single crystal semiconductor layer are formed such that the total thickness of the first single crystal semiconductor layer and the second single crystal semiconductor layer is 800 nm or more.

20. The method for manufacturing a photoelectric conversion device, according to claim 14, wherein the first impurity semiconductor layer is a p-type impurity semiconductor layer, and wherein the second impurity semiconductor layer is an n-type impurity semiconductor layer.

21. The method for manufacturing a photoelectric conversion device, according to claim 14, wherein the first semiconductor layer is formed by a plasma chemical vapor deposition method in which a flow ratio of a hydrogen gas to a silane based gas is 50:1 or more.

22. The method for manufacturing a photoelectric conversion device, according to claim 21, wherein the silane based gas is silane or disilane.

23. The method for manufacturing a photoelectric conversion device, according to claim 21, wherein the plasma chemical vapor deposition method is performed under a pressure of from 1 Pa to $10^3$ Pa.

24. The method for manufacturing a photoelectric conversion device, according to claim 14, wherein the first impurity semicondcutor layer and the second impurity semiconductor layer are formed by an ion implantation method or an ion doping method.

25. The method for manufacturing a photoelectric conversion device, according to claim 14, wherein the first single crystal semiconductor layer is irradiated with a laser beam to repair or remove a crystal defect included in the first single crystal semicondcutor layer.

26. The method for manufacturing a photoelectric conversion device, according to claim 14, wherein the second single crystal semicondcutor layer is formed by heating the first semiconductor layer and the second semiconductor layer by rapid thermal annealing.

27. A method for manufacturing a photoelectric conversion device, comprising:

forming a first electrode over a single crystal semicondcutor substrate;

irradiating the single crystal semiconductor substrate with ions to form an embrittlement layer in the single crystal semiconductor substrate;

forming a first impurity semiconductor layer over the single crystal semicondcutor substrate;

forming an insulating layer over the first electrode;

attaching the insulating layer and a supporting substrate to each other to bond the single crystal semiconductor substrate and the supporting substrate and then separating the single crystal semiconductor substrate along the embrittlement layer, whereby a stack including the insulating layer, the first electrode, the first impurity semiconductor layer, and a first single crystal semiconductor layer is provided on the supporting substrate;

forming a first semiconductor layer over the first single crystal semiconductor layer;

forming a second semiconductor layer over the first semiconductor layer under a condition different from those of the first semiconductor layer;

forming a second single crystal semiconductor layer by improving crystallinity of the first semiconductor layer and the second semiconductor layer by solid phase growth;

forming a second impurity semiconductor layer having a conductivity type opposite to that of the first impurity semiconductor layer over the second single crystal semiconductor layer; and forming a second electrode over the second impurity semiconductor layer.

28. The method for manufacturing a photoelectric conversion device, according to claim 27, wherein the first semiconductor layer and the second semiconductor layer are formed such that crystallinity of the first semiconductor layer is higher than that of the second semiconductor layer.

29. The method for manufacturing a photoelectric conversion device, according to claim 27, wherein the first semiconductor layer and the second semiconductor layer are formed such that hydrogen concentration of the first semiconductor layer is lower than that of the second semiconductor layer.

30. The method for manufacturing a photoelectric conversion device, according to claim 27, wherein the first semiconductor layer is formed to a thickness of from 10 nm to 50 nm.

31. The method for manufacturing a photoelectric conversion device, according to claim 27, wherein ions generated with a source gas containing hydrogen are used as the ions.

32. The method for manufacturing a photoelectric conversion device, according to claim 27, wherein the first single crystal semiconductor layer and the second single crystal semiconductor layer are formed such that the total thickness of the first single crystal semiconductor layer and the second single crystal semiconductor layer is 800 nm or more.

33. The method for manufacturing a photoelectric conversion device, according to claim 27, wherein the first impurity semiconductor layer is a p-type impurity semiconductor layer, and wherein the second impurity semiconductor layer is an n-type impurity semiconductor layer.

34. The method for manufacturing a photoelectric conversion device, according to claim 27,
wherein the first semiconductor layer is formed by a plasma chemical vapor deposition method in which a flow ratio of a hydrogen gas to a silane based gas is 50:1 or more.

35. The method for manufacturing a photoelectric conversion device, according to claim 34,
wherein the silane based gas is silane or disilane.

36. The method for manufacturing a photoelectric conversion device, according to claim 34,
wherein the plasma chemical vapor deposition method is performed under a pressure of from 1 Pa to $10^3$ Pa.

37. The method for manufacturing a photoelectric conversion device, according to claim 27,
wherein the first impurity semicondcutor layer and the second impurity semiconductor layer are formed by an ion implantation method or an ion doping method.

38. The method for manufacturing a photoelectric conversion device, according to claim 27,
wherein the first single crystal semiconductor layer is irradiated with a laser beam to repair or remove a crystal defect included in the first single crystal semicondcutor layer.

39. The method for manufacturing a photoelectric conversion device, according to claim 27, wherein the second single crystal semicondcutor layer is formed by heating the first semiconductor layer and the second semiconductor layer by rapid thermal annealing.

40. A method for manufacturing a photoelectric conversion device, comprising:
forming a first electrode and a first impurity semiconductor layer over a single crystal semicondcutor substrate;
irradiating the single crystal semiconductor substrate with ions to form an embrittlement layer in the single crystal semiconductor substrate;
forming an insulating layer over the first electrode;
attaching the insulating layer and a supporting substrate to each other to bond the single crystal semiconductor substrate and the supporting substrate and then separating the single crystal semiconductor substrate along the embrittlement layer, whereby a stack including the insulating layer, the first electrode, the first impurity semiconductor layer, and a first single crystal semiconductor layer is provided on the supporting substrate;
forming a first semiconductor layer over the first single crystal semiconductor layer;
forming a second semiconductor layer over the first semiconductor layer under a condition different from that of the first semiconductor layer;
improving crystallinity of the first semiconductor layer and the second semiconductor layer by solid phase growth;
forming a second impurity semiconductor layer having a conductivity type opposite to that of the first impurity semiconductor layer over the second semiconductor layer; and
forming a second electrode over the second impurity semiconductor layer.

41. The method for manufacturing a photoelectric conversion device, according to claim 40,
wherein the first semiconductor layer and the second semiconductor layer are formed such that crystallinity of the first semiconductor layer is higher than that of the second semiconductor layer.

42. The method for manufacturing a photoelectric conversion device, according to claim 40,
wherein the first semiconductor layer and the second semiconductor layer are formed such that hydrogen concentration of the first semiconductor layer is lower than that of the second semiconductor layer.

43. The method for manufacturing a photoelectric conversion device, according to claim 40,
wherein the first semiconductor layer is formed to a thickness of from 10 nm to 50 nm.

44. The method for manufacturing a photoelectric conversion device, according to claim 40,
wherein ions generated with a source gas containing hydrogen are used as the ions.

45. The method for manufacturing a photoelectric conversion device, according to claim 40,
wherein the first single crystal semiconductor layer, the first semiconductor layer, and the second semiconductor layer are formed such that the total thickness thereof is 800 nm or more.

46. The method for manufacturing a photoelectric conversion device, according to claim 40,
wherein the first impurity semiconductor layer is a p-type impurity semiconductor layer, and
wherein the second impurity semiconductor layer is an n-type impurity semiconductor layer.

47. The method for manufacturing a photoelectric conversion device, according to claim 40,
wherein the first semiconductor layer is formed by a plasma chemical vapor deposition method in which a flow ratio of a hydrogen gas to a silane based gas is 50:1 or more.

48. The method for manufacturing a photoelectric conversion device, according to claim 47,
wherein the silane based gas is silane or disilane.

49. The method for manufacturing a photoelectric conversion device, according to claim 47,
wherein the plasma chemical vapor deposition method is performed under a pressure of from 1 Pa to $10^3$ Pa.

50. The method for manufacturing a photoelectric conversion device, according to claim 40,
wherein the first impurity semicondcutor layer and the second impurity semiconductor layer are formed by an ion implantation method or an ion doping method.

51. The method for manufacturing a photoelectric conversion device, according to claim 40,
wherein the first single crystal semiconductor layer is irradiated with a laser beam to repair or remove a crystal defect included in the first single crystal semicondcutor layer.

52. The method for manufacturing a photoelectric conversion device, according to claim 40,
wherein the improving of crystallinity is performed by heating the first semiconductor layer and the second semiconductor layer by rapid thermal annealing.

* * * * *